United States Patent [19]

Akizawa et al.

[11] Patent Number: 5,398,206
[45] Date of Patent: Mar. 14, 1995

[54] SEMICONDUCTOR MEMORY DEVICE WITH DATA ERROR COMPENSATION

[75] Inventors: Mitsuru Akizawa, Hachioji; Kazuhiko Iwasaki, Chiba; Kouki Noguchi, Kokubunji; Ryuuji Shibata; Noboru Yamaguchi, both of Hagashiyamato, all of Japan

[73] Assignee: Hitachi, Ltd., Tokyo, Japan

[21] Appl. No.: 654,379

[22] Filed: Feb. 12, 1991

[30] Foreign Application Priority Data

Mar. 2, 1990 [JP] Japan ............................... 2-049357
Aug. 22, 1990 [JP] Japan ............................... 2-218892

[51] Int. Cl.⁶ ........................... G11C 7/00; G11C 8/00
[52] U.S. Cl. ........................ 365/200; 365/230.01; 365/230.03; 365/230.06; 365/230.08
[58] Field of Search ............... 365/177, 203, 230.08, 365/230.06, 189.08, 200, 210, 233, 230.01, 230.03

[56] References Cited

U.S. PATENT DOCUMENTS

| | | | |
|---|---|---|---|
| 4,663,735 | 5/1987 | Novak et al. | 365/233 |
| 4,839,860 | 6/1989 | Shinoda et al. | 365/210 |
| 4,901,285 | 2/1990 | Sano et al. | 365/230.06 |
| 4,982,372 | 1/1991 | Matsuo | 365/230.06 |
| 5,005,154 | 4/1991 | Masuda | 365/230.06 |
| 5,034,928 | 7/1991 | Isobe | 365/230.06 |
| 5,043,945 | 8/1991 | Bader | 365/203 |
| 5,047,983 | 9/1991 | Iwai et al. | 365/230.06 |
| 5,073,873 | 12/1991 | Nogami | 365/230.08 |
| 5,117,382 | 5/1992 | Maejima et al. | 365/177 |
| 5,126,973 | 6/1992 | Gallia et al. | 365/230.06 |
| 5,128,896 | 7/1992 | Yamada et al. | 365/203 |
| 5,136,535 | 8/1992 | Scharrer et al. | 365/177 |
| 5,146,429 | 9/1992 | Kawai et al. | 365/200 |
| 5,155,703 | 10/1992 | Nogle | 365/177 |
| 5,179,536 | 1/1993 | Kasa et al. | 365/200 |
| 5,193,074 | 3/1993 | Anami | 365/230.06 |
| 5,195,057 | 3/1993 | Kasa et al. | 365/200 |

FOREIGN PATENT DOCUMENTS 01-241100 9/1989 Japan .

Primary Examiner—Timothy P. Callahan
Assistant Examiner—Trong Phan
Attorney, Agent, or Firm—Fay, Sharpe, Beall, Fagan, Minnich & McKee

[57] ABSTRACT

A semiconductor memory device includes signal lines, a decoder for decoding an inputted address to output the decoded result to some of the signal lines, a matrixed memory array, a part of which being pre-specified as a compensated area, read out means for reading out data from memory cells in an area specified in accordance with a decode signal on the some signal line, a detector for detecting that the address is related with the compensated area from the decode signal on the some signal lines, the compensated area being pre-related with the some signal lines, and a fixed data outputting circuit for merging predetermined data into a predetermined part of the data read out from the memory cells in accordance with the detection signal to output the merged data. The fixed data outputting circuit is controlled by a control circuit in response to a merge control signal to output the data read out from the memory cells without the merging operation.

23 Claims, 33 Drawing Sheets

F I G. 15
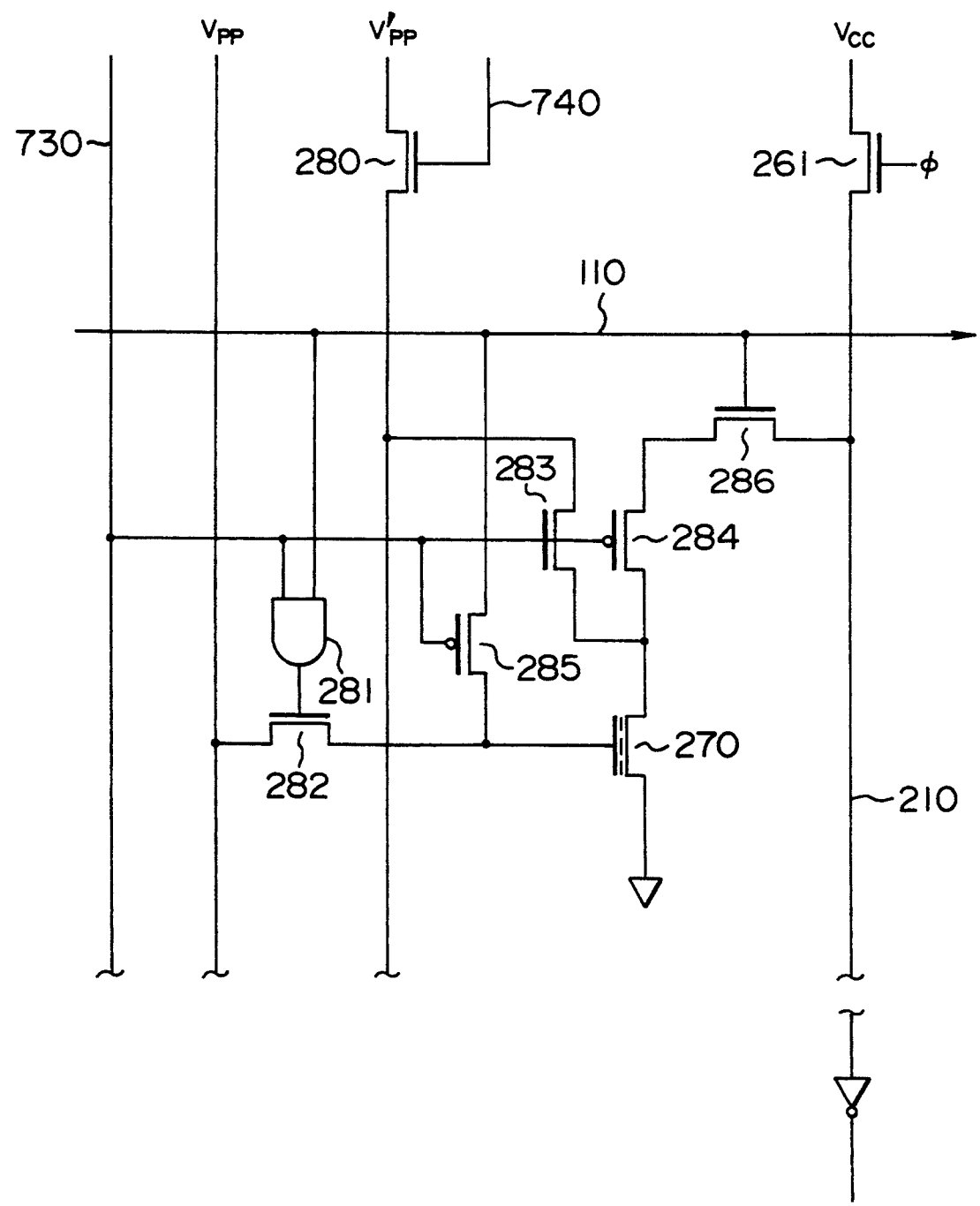

F I G. 19
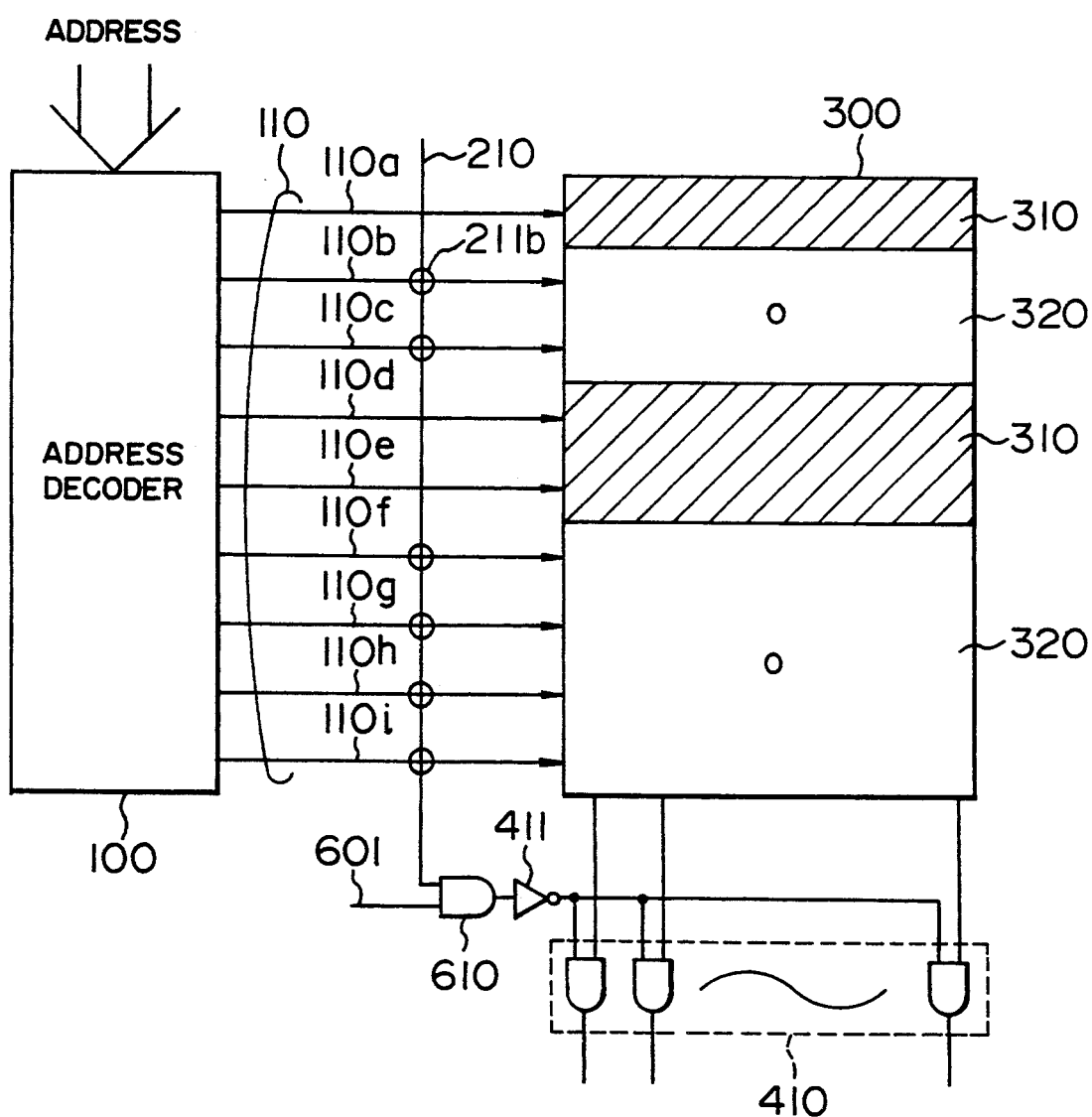

FIG. 33

| MEMORY CAPACITY (bits) | 1M | | 2M | | 4M | | 8M | | 16M | |
|---|---|---|---|---|---|---|---|---|---|---|
| WORD (bits) | X8 | X16 | X8 | X16 | X8 | X16 | X8 | X16 | X8 | X16 |
| $T_c/T_n$ | 1.68 | 1.50 | 1.69 | 1.52 | 1.70 | 1.53 | 1.71 | 1.54 | 1.72 | 1.56 |
| $T_I/T_n$ | 1.04 | 1.03 | 1.04 | 1.03 | 1.04 | 1.03 | 1.04 | 1.03 | 1.03 | 1.03 |

SEMICONDUCTOR MEMORY DEVICE WITH DATA ERROR COMPENSATION

BACKGROUND OF THE INVENTION

1. Field of the Invention

The present invention relates to a semiconductor memory device or a semiconductor integrated circuit, and in particular to technology for compensating for a data error due to a defect in the semiconductor memory device or the semiconductor integrated circuit having the same incorporated therein.

2. Description of the Related Art

Lowering of a manufacturing yield of a semiconductor integrated circuit due to defects generated in the course of a manufacturing process has been a problem in association with increase in the integration degree of the semiconductor integration circuit.

For example, in an LSI logical circuit, an error may occur in logical value due to such a defect. In order to provide the circuit with defect compensating capability for automatically correcting the error, an additional circuit for defect compensation, e.g., a redundancy circuit must be generally provided on a chip, resulting in enhancing the manufacturing yield.

An example of the technology for enhancing the manufacturing yield by compensating for a defect in an unused area of a semiconductor memory, in particular a read-only memory is described in Japanese Unexamined Patent Publication No. JP-A-1-241100. In this prior art, an additional decoder for detecting access to an unused area or a compensated area is provided in a ROM in addition to the usual decoder. In other words, a control signal is generated by the additional decoder in response to an input of an address for accessing the compensated area. Predetermined fixed data is outputted, in place of data read out from the compensated area, in response to the control signal.

In this manner, it is necessary to provide the additional decoder for compensated area in addition to the usual decoder for accessing a ROM in a prior art. Therefore, increase in the number of elements in the additional decoder, and in turn increase in an area of a chip for the additional decoder has been invited. Further, a maximum number of the compensated areas and the size of each area are fixed based on a structure of the additional decoder so that the flexibility for a compensation system is lack. For example, it is impossible to compensate for a defect in an area which includes consecutive "0" or "1" bits or which has a size smaller than that of the compensated area specified by the additional decoder. If the number of the compensated areas exceeds a maximum number of decoded outputs of the additional decoder, compensation has to be abandoned.

In the above mentioned prior art, the additional decoder having the same scale as that of the usual decoder is required to solve the problems related with the flexibility. This invites a remarkable increase in the number of elements in the additional decoder. A term "the number of compensated areas" means number of compensated areas when a total compensated area is divided into the compensated areas by areas for which compensation is not required, i.e., non-compensated areas and a term "the size of a compensated area" means the dimension of an address space for the compensated area.

The semiconductor memory device which is capable of compensating for a defect by merely adding a less number of elements have been strongly demanded. In order to further enhance the manufacturing yield, it is preferable to provide means for reading out data in a memory area after compensating means is set in a invalid state when a defect exists in the compensating means but no defect exists in a subjective memory area.

Since the compensating means is only overhead for a chip area if a sufficient manufacturing yield has been obtained by learning of the manufacturing process of semiconductor integrated circuits, it is important to verify the validity of the compensating means by checking an error which may occur when the compensating means is not used.

SUMMARY OF THE INVENTION

It is an object of the present invention to provide a semiconductor memory device which is capable of compensating for a defect by slight increase in the number of circuit elements.

It is another object of the present invention to provide a semiconductor memory device which is capable of flexibly compensating for a defect while suppressing increase in the number of circuit elements.

In order to accomplish the above-mentioned objects, a semiconductor memory device of the present invention comprises information storing means including a plurality of semiconductor memory elements, address decoding means for decoding an address to access at least one of the plurality of semiconductor memory elements, and outputting means responsive to the decoded result from the decoding means for outputting given fixed data independently of information stored in the at least one semiconductor memory element.

According to the present invention, it is not necessary to separately provide two address decoding means, i.e., a compensating decoder and an address decoder, since detection of the compensated area can be performed in response to the decoding result by one address decoding means (the address decoder).

Further, compensation for a defect can be achieved in unit of an area specified by the address decoding means so that flexibility of compensation can be enhanced.

In order to accomplish the above mentioned objects, the semiconductor memory device comprises information storing means including a plurality of semiconductor memory elements, address decoding means for decoding an address to access at least one of the plurality of semiconductor memory elements, output control means for generating a control signal in response to the decoding result by the address decoding means, and outputting means responsive to the control signal for selectively outputting one of information including given fixed information and information read out from the at least one semiconductor memory element.

According to the present invention, slight increase in the number of circuit elements makes it possible to turn on or off an defect compensation function in a semiconductor memory device, thereby to read out the content of the defect compensated area when compensating means is not used. This means that either one of doubled outputs can be selectively outputted. Accordingly, if the defect occurs in the compensating means, a further increased in the manufacturing yield can be achieved by using a subjective memory area if it has no defect.

Detection of validity of the compensating means is made easier due to a fact that the content in the compensated area can be really read out. Trade off between overhead of a chip area and effect of increase in the manufacturing yield by the introduction of the compensating means can be achieved. Accordingly, the time when a sufficient yield is achieved without the compensating means based on learning of a manufacturing process can be appropriately known. Thereafter, an advantageous effect of reduction in cost can be achieved by removing the compensating means to reduce an area of the chip.

BRIEF DESCRIPTION OF THE DRAWINGS

FIG. 15 is a view showing the structure of the selection detecting means in FIG. 14;

FIGS. 18 and 19 are a structural conceptual view and a detailed structural view of a second embodiment of a semiconductor memory device of the present invention, respectively;

FIGS. 32 and 33 are views for illustrating the effects of the present invention.

DESCRIPTION OF THE PREFERRED EMBODIMENTS

A semiconductor memory device of the present invention will now be described with reference to the accompanying drawings.

Figure 1:
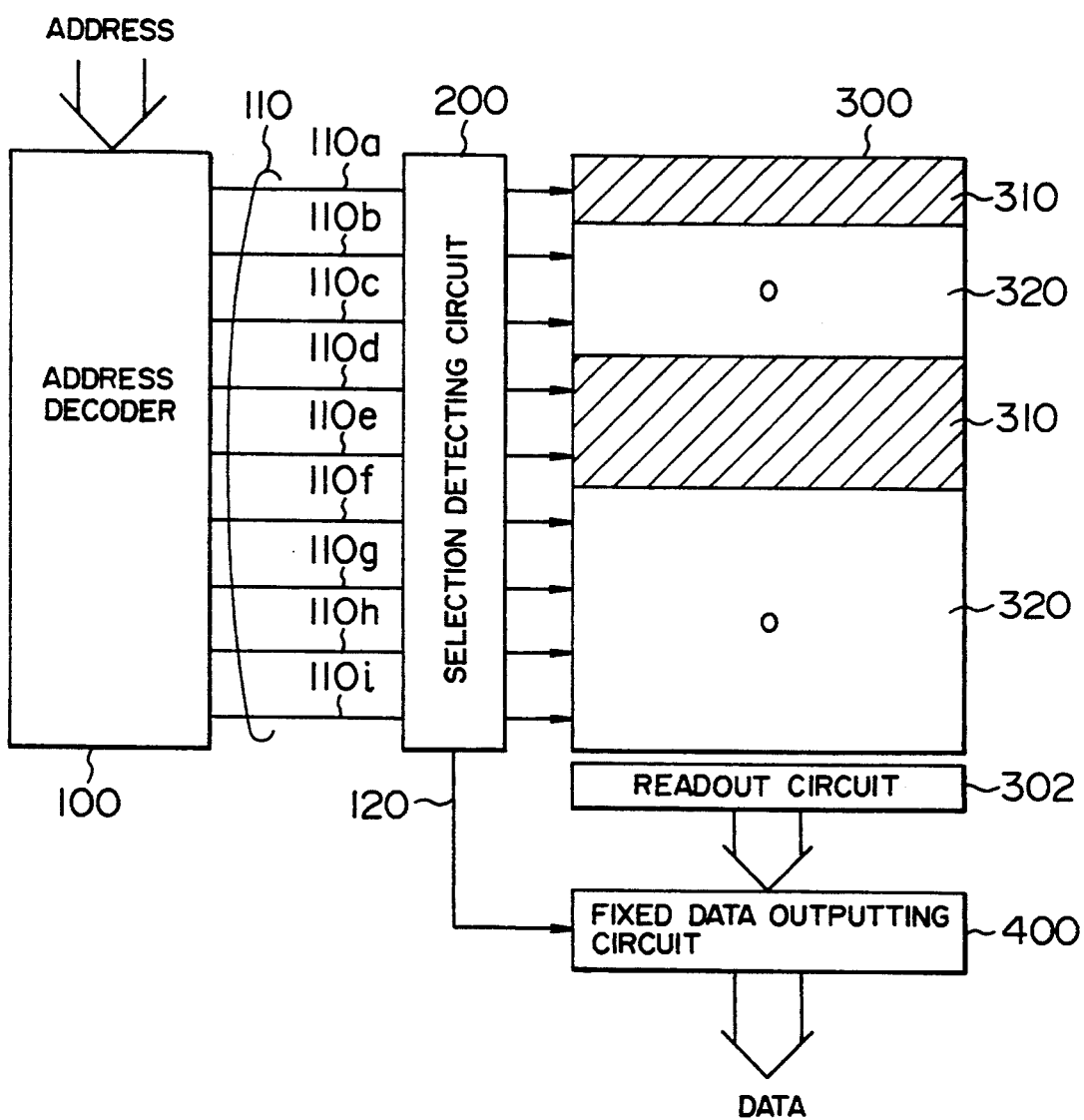
FIGS. 1 and 2 are a conceptual structural view and a detailed structural view of a first embodiment of a semiconductor memory device of the present invention, respectively.

Firstly, concept of the semiconductor memory device according to a first embodiment of the present invention will be described below in detail with reference to FIG. 1. The semiconductor memory device includes a memory cell array having a plurality of semiconductor memory cells arrayed in a matrix manner, an address decoder for decoding address signals and generating signals to specify a given area in the memory cell array, a readout circuit for reading data stored in the given area specified by the generated signals, a selection detecting circuit for detecting that at least a part of predetermined signal lines has been selected by the signals generated by said address decoder, and a fixed data output circuit for outputting data including predetermined data when the selection is detected by the selection detecting circuit and for outputting data from the readout circuit when the selection is not detected.

The first embodiment of the semiconductor memory device to which the present invention is applied will be now described in detail with reference to the accompanying drawings. Structure of the semiconductor memory device according to the first embodiment of the present invention is illustrated in FIG. 1. As shown in FIG. 1, an address decoder 100 is arranged to decode an address which are inputted thereto. In this embodiment, one word horizontally arrayed in a memory cell array 300, e.g., a 16-bit area is specified by the address. Compensation for a defect is accomplished in unit of word in the present invention. A selection detecting circuit 200 provided between the decoder 100 and the memory cell array 300 is connected to decoder result output lines, i.e., word lines 110 (110a to 110i) and detects access to a portion of an area 320 to be compensated for, i.e., a compensated area. A detection signal representative of a result of the detection is fed to a fixed data outputting circuit 400 via a detection signal line 120. The circuit 400 forcedly outputs given fixed data depending upon data to be stored in the compensated area 320. More details of the operation is as follows.

A case in which each word in the compensated area 320 should be composed of consecutive 16 "0" bits will be exemplarily described. When a word area of the compensated area 320 is accessed, any one of specific word lines 110b, 110c, 110f, 110g, 110h and 110i becomes active to make it possible to select the word area. The circuit 200 is electrically connected to the specific word lines and detects access to any word areas of the compensated area 320. A detection signal representative of a detecting result is transmitted to the circuit 400 via the detection signal line 120. The circuit 400 outputs word data of all "0" bits irrespective of a real content in the compensated area 320, i.e. data really stored in the word area. However, when an any word area of a non-compensated area 310 for which no compensation is required is accessed, a detection signal from the circuit 200 is not rendered enable. Therefore, the circuit 400 outputs the data read out from the memory cell array 300 by the readout circuit 302 including a sense amplifier circuit, i.e., original data really stored in the non-compensated area 310.

In the present invention, an area in which "0" bits should be consecutive is referred to as "0-compensated area". Similarly, an area in which "1" bits should be consecutive will be referred to as "1-compensated area".

If a location of the compensated area in a memory address space can be determined, the word lines 110 to which the circuit 200 should be electrically connected can be determined. Accordingly, if the semiconductor memory device is a mask ROM, for example, the compensated area is determined in accordance with data when the data is written into the memory array 300 in the course of manufacturing process of the memory device. The specific word lines to which the circuit 200 should be electrically connected are determined in accordance with an arrangement of the compensated area for the data to be written in the memory array 300. The semiconductor memory device may be an electrically programmable ROM, e.g., an EPROM. In this case, it is necessary to additionally provide a circuit for writing data into the EPROM.

More details of the present embodiment will be described with reference to FIG. 2. The readout circuit 302 including a sense amplifier circuit and the like for reading data from the memory cell array 300 is omitted from the drawing. The address decoder 100 decodes an inputted addresses and provides the decoded result to any word line 110. The memory device further includes the selection detecting circuit 200 having a detection line 210 electrically connected to specific ones of the word lines 110 for detecting access to the compensated area and the fixed data outputting circuit 400 having a gate 411 for inverting the logical state of a detection signal on the detection line 210 and AND gates 410 for outputting fixed "0" bits data in accordance with the data read out from the memory cell array 300 and an output of the gate 411 only when the compensated area is accessed.

The memory cell array 300 is composed of compensated areas 320 and non-compensated areas 310. Only the specific word lines 110b, 110c, 110f, 110g, 110h, 110i for accessing the compensated areas 320 are electrically connected to the detection line 210. The connection patterns 211 are represented by circles in the drawing. A wired OR logic operation between the detection signal on the detection line 210 and the signal on each of the specific word lines 110b, 110c, 110f, 110g, 110h, 110i is performed. Accordingly, when any one of the specific word lines 110b, 110c, 110f, 110g, 110h and 110i is not to be logic "1" by the decoder 100, the detection signal is also set to be logic "1". The detection signal is inverted into a state of logic "0" and is then supplied to one of inputs of each AND gate 410. Therefore, the output of each of the gates 410 is set to be logical value "0" independently of the data read out from the memory cell array 300. In this manner, desired "0" bit data can be outputted even if "1" bits are contained in the data read out from the compensated area 320 due to a defect present in the compensated area 320 which should subjectively output "0" bit data.

On the other hand, when any one of word addresses in the non-compensated area 310 is accessed, all the specific word lines 110b, 110c, 110f, 110g, 110h and 110i are kept being at logical value "0". Therefore, the detection signal on the detection line 210 is set to be logical value "0". Since the detection signal of logical value "1" is supplied to each of the gates 410, the data read out from the memory cell array 300 can be outputted without being converted.

Figure 2:
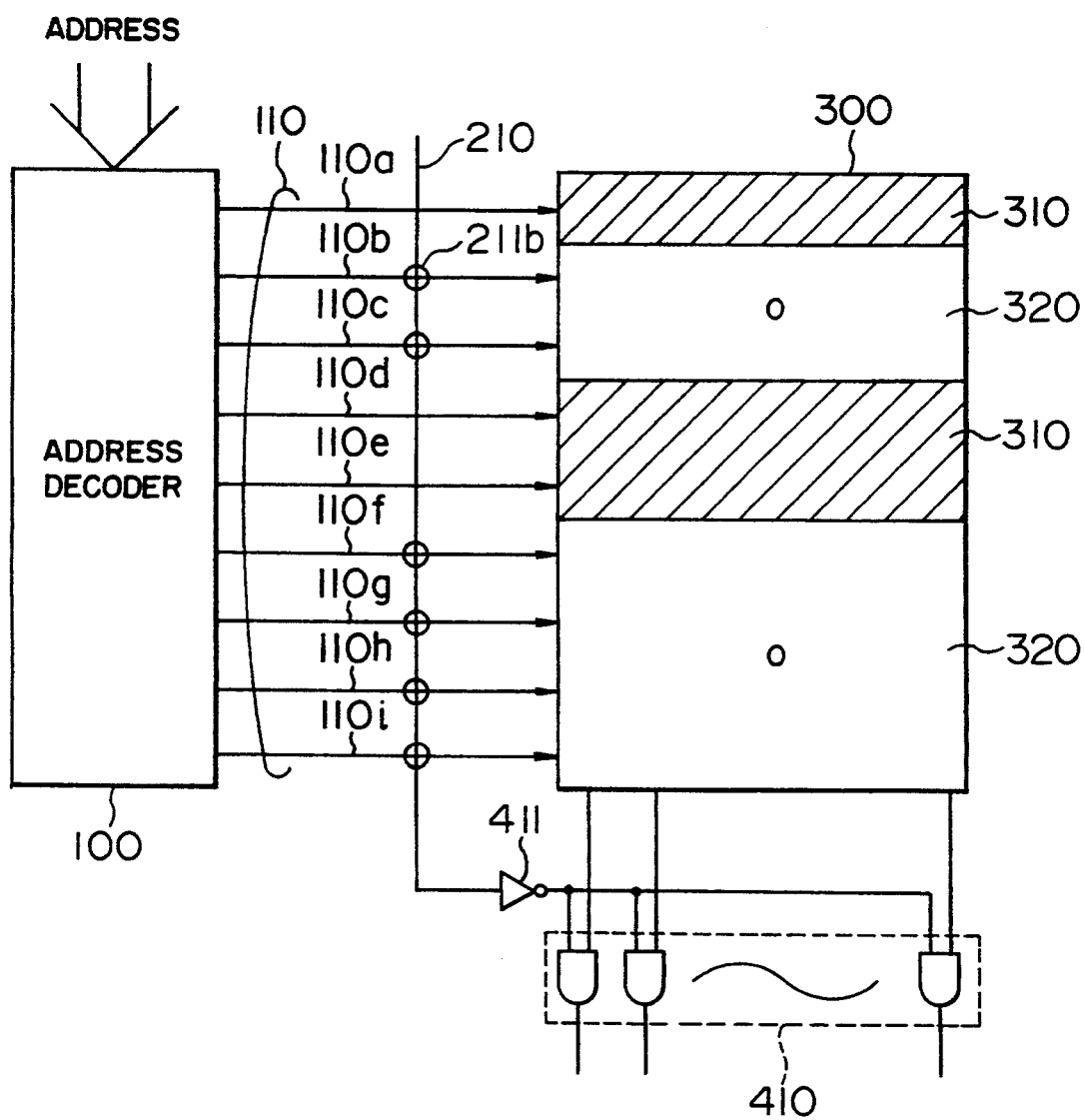
Figure 3:
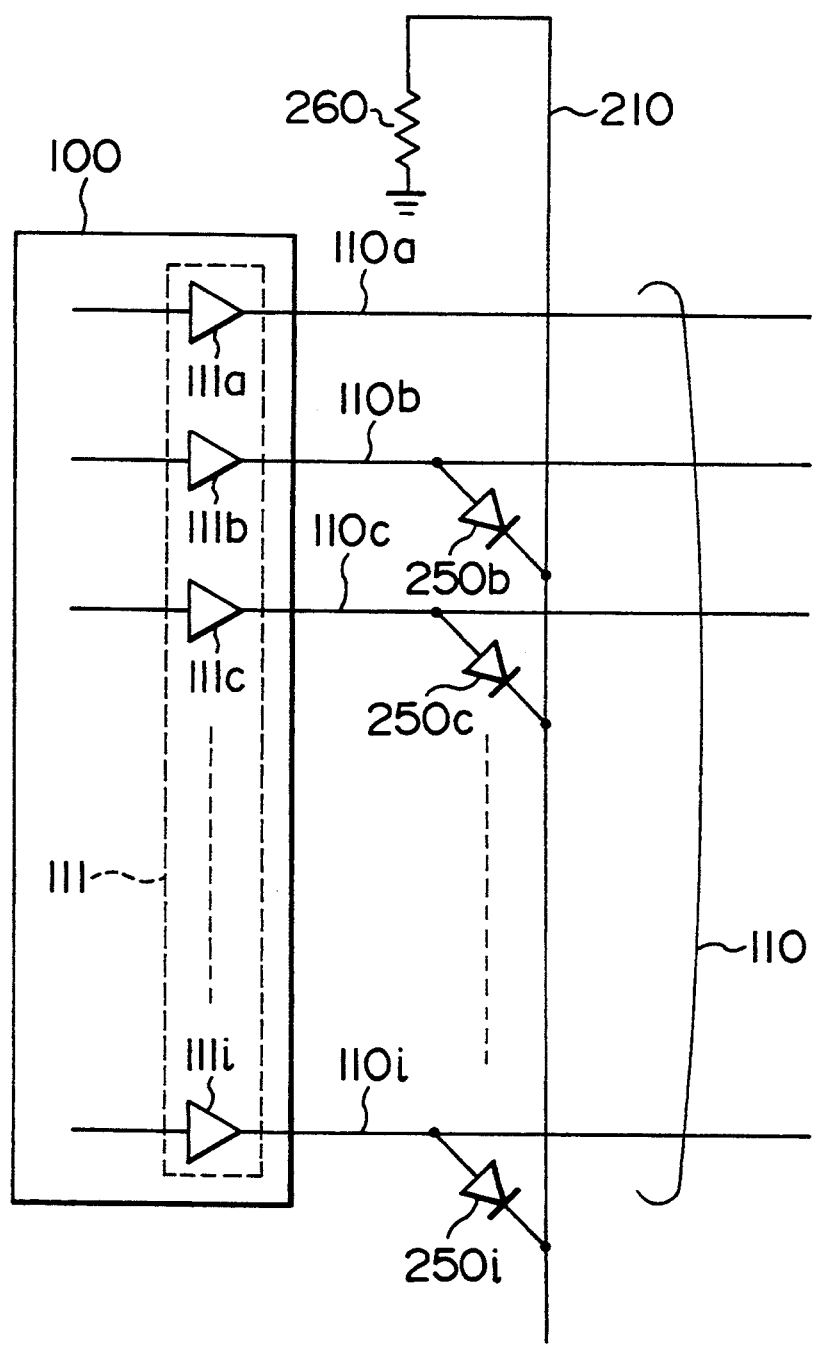
FIGS. 3 and 4 are views showing connecting patterns between word lines and a detection line.

FIG. 3 is a circuit diagram showing a modification of the connection patterns 211 between the word lines 110 and the detection line 210 in FIG. 2. Each connection pattern is realized by a diode 250 (250b, 250c, ..., 250i). The detection line 210 is grounded at an end opposite to the inverting gate 411 via a resistor 260 having a high resistance. When the word line 110c connected to the detection line 210 is selected, an electric current flows to the detection line 210 via a diode 250c from a driver 111c in a word line driver 111 (not shown in FIG. 2) within the address decoder 100. This causes the potential level of the detection line 210 to become high, i.e. a logical value "1" so that access to the compensated area can be detected.

Figure 4:
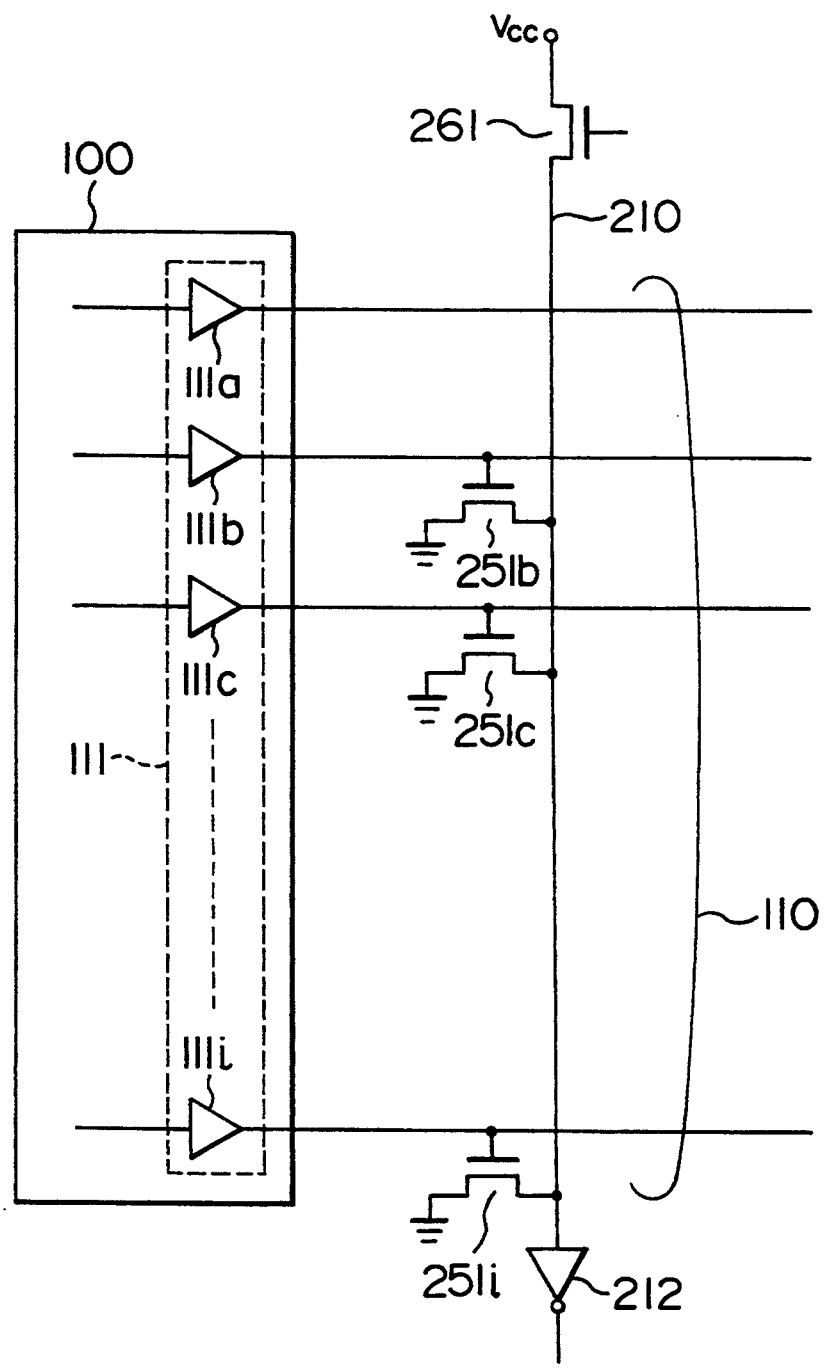

FIG. 4 is a diagram showing an example of another connection pattern. In the example, each connection pattern is realized by a transistor 250 (251b, 251c, ..., 251i). The detection line 210 is connected to a power source $V_{cc}$ through a precharge transistor 261. The detection line 210 is precharged to a high level by the precharge transistor 261. When the specific line 110c connected to the detection line 210 is selected, a high voltage is applied to the gate of the transistor 251c via the word line driver 111c so that the transistor 251c is turned on. This causes the detection line 210 to be grounded, resulting in that the potential level of the line 210 becomes low. The detection signal of a logical value "1" is applied to the gate 411 via an inverter 212 so that an access to the compensated area can be detected.

In accordance with the present embodiment, each word area of a 0-compensated area can be selected in unit of output signal of the address decoder independently of the data read out from the memory cell array 300.

Figure 5:
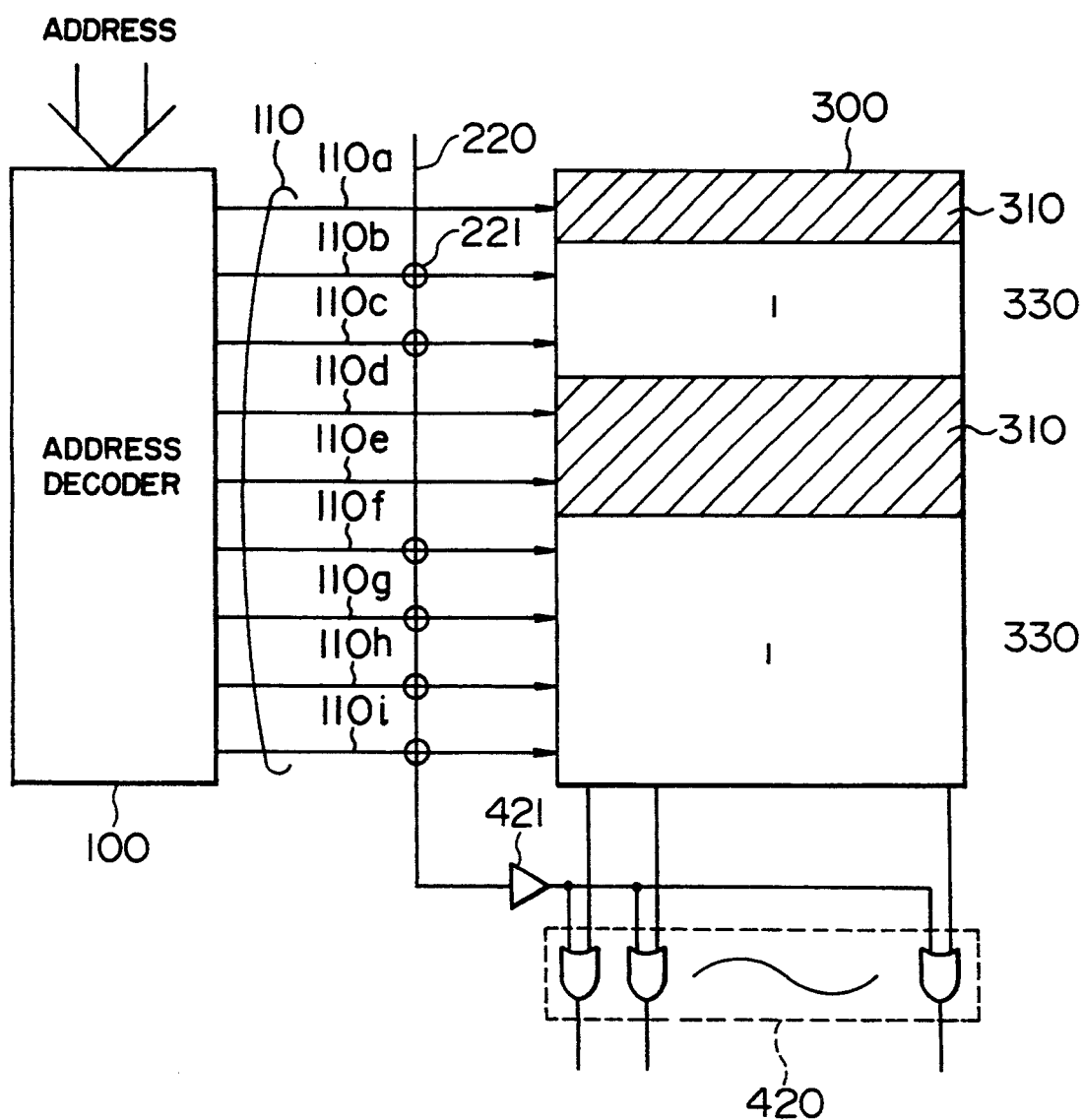
FIG. 5 is a structural view showing a modification of the embodiment of the semiconductor memory device shown in FIG. 2.

FIG. 5 shows another modification of the embodiment of the present invention shown in FIG. 2 for compensating for a defect in a word area including only "1" bits in the memory cell array, i.e., a "1-compensated area". The differences in structure between the embodiments of FIGS. 2 and 5 reside in the gates 420 and 421.

A operation of the embodiment of FIG. 5 is substantially identical to that of FIG. 2. Fixed "1" bit data is outputted from the gate 420 only upon access to the 1-compensated area 330. This makes it possible to output desired word data, 16 bits of "1", even if bits of "0" are contained in the word data really stored due to a defect existing in the compensated area 330.

Figure 6:
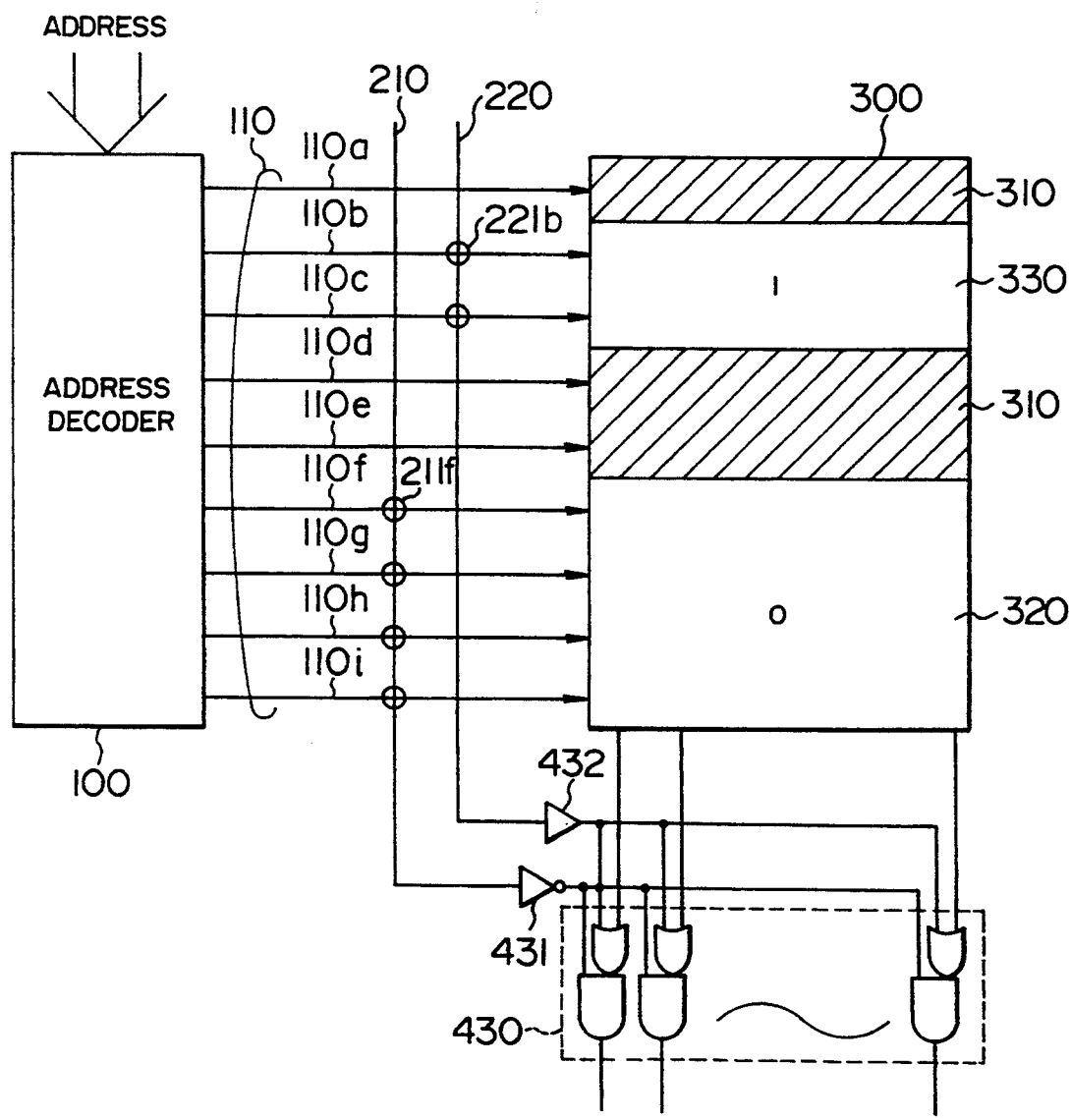
FIG. 6 shows a modified embodiment of a semiconductor memory device when the embodiments shown in FIGS. 2 and 5 are combined.

FIG. 6 shows a further modified embodiment of the present invention in which the above mentioned two embodiments are combined. In this embodiment, both a defect in the area 320 in which bits of "0" should be subjectively consecutive and a defect in the area 330 in which bits of "1" should be subjectively consecutive are compensated for.

First specific word lines 110*f* to 110*i* of the word lines 110 to which the decoding result are outputted from the decoder 100 are electrically connected to a detection line 210 and used to detect access to the 0-compensated area 320. A gate 431 inverts the logical value of a detection signal on the detection line 210 and output the inverted value to complex gates 430. Second specific word lines 110*b* and 110*c* are electrically connected to a detection line 220 and used to detect access to the 1-compensated area 330. A gate 432 transmits the logical value of a detection signal on the detection line 220 to the gates 430. Only when the 0- or 1-compensated area is accessed, data including fixed data, bits of "0" or "1" is outputted from the gates 430 in accordance with the data stored in the memory cell array 300 and the outputs of the gates 431 and 432. Areas 310 in the memory cell array are non-compensated areas.

When any word area in the 0-compensated area 320 is accessed, the detection signal on the detection line 210 is set to be a logical value "1", and is outputted to the complex gates 430 after the logical value of the detection signal is inverted from "1" to "0" by the gate 431. Accordingly, the outputs of the complex gates 430 are set to be "0" bits independently of data read out from the memory cell array 300 and the output of the gate 432. Therefore, compensation for a defect can be performed even if the defect exists in the 0-compensated area. Similarly, the outputs of the complex gates 430 become "1" bits independently of the data read out from the memory cell array when any word area of the 1-compensated area 330 is accessed. Therefore, compensation for a defect can be performed even if the defect exists in the 1-compensated area 330.

Figure 7:
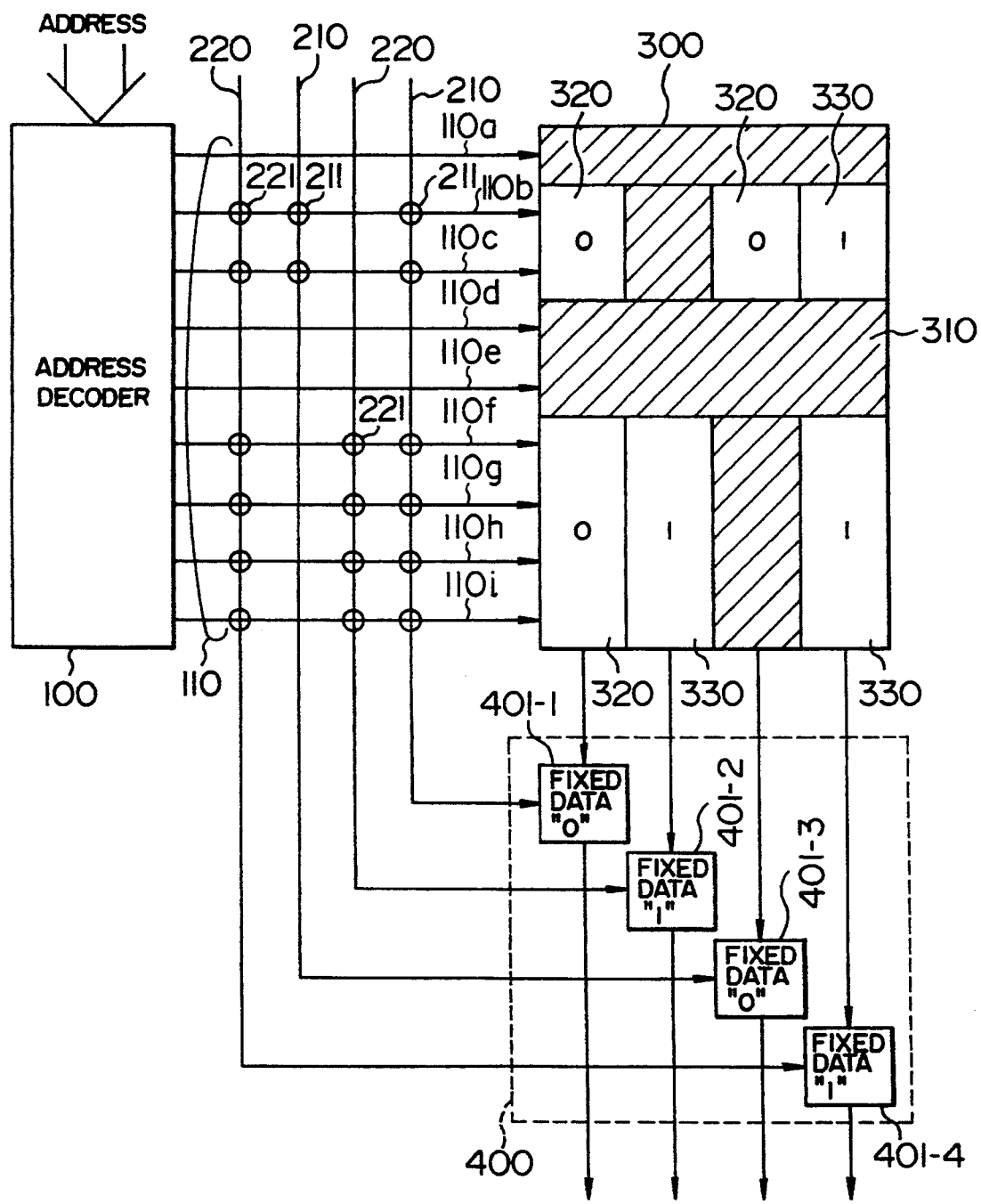
FIG. 7 is a structural view of a modified embodiment of the semiconductor memory device which performs compensation in unit of field.

A further modified embodiment of the present invention is shown in FIG. 7. In this embodiment, each word area is divided into a plurality of fields. Compensation is carried out in unit of the field.

In this embodiment, one word area of 16 bits is divided into four fields, each having four bits, and detection lines 210 and 220 and fixed data outputting circuits 401 (401-1, 401-2, 401-3, 401-4) are provided. Fixed data "0" or "1" is determined for each compensated field. Since compensation in unit of field can be performed based on connection patterns 211 and 221 between the detection lines 210 and 220 and the word lines 110, the 0- and 1-compensated fields 320 and 330 and a non-compensated field 310 can be present in one word area of the same address. Each fixed data outputting circuit makes it possible to compensate for data read out from a memory cell array 300, in which bits of "0" and "1" combinedly exist by changing the circuit arrangement, as well as compensation for "0-" and "1-" defects.

Although one word area is composed of four fields, each being composed of four bits and the bit width of each field is same in the present embodiment, the bit width of each field and the number of fields of the one word area may be desired values. Further, in accordance with the present embodiment, one word area which is accessed by one word line may be divided into a plurality of fields, and presetting of compensation and non-compensation and presetting of fixed data upon the compensation are possible in unit of field.

Figure 8:
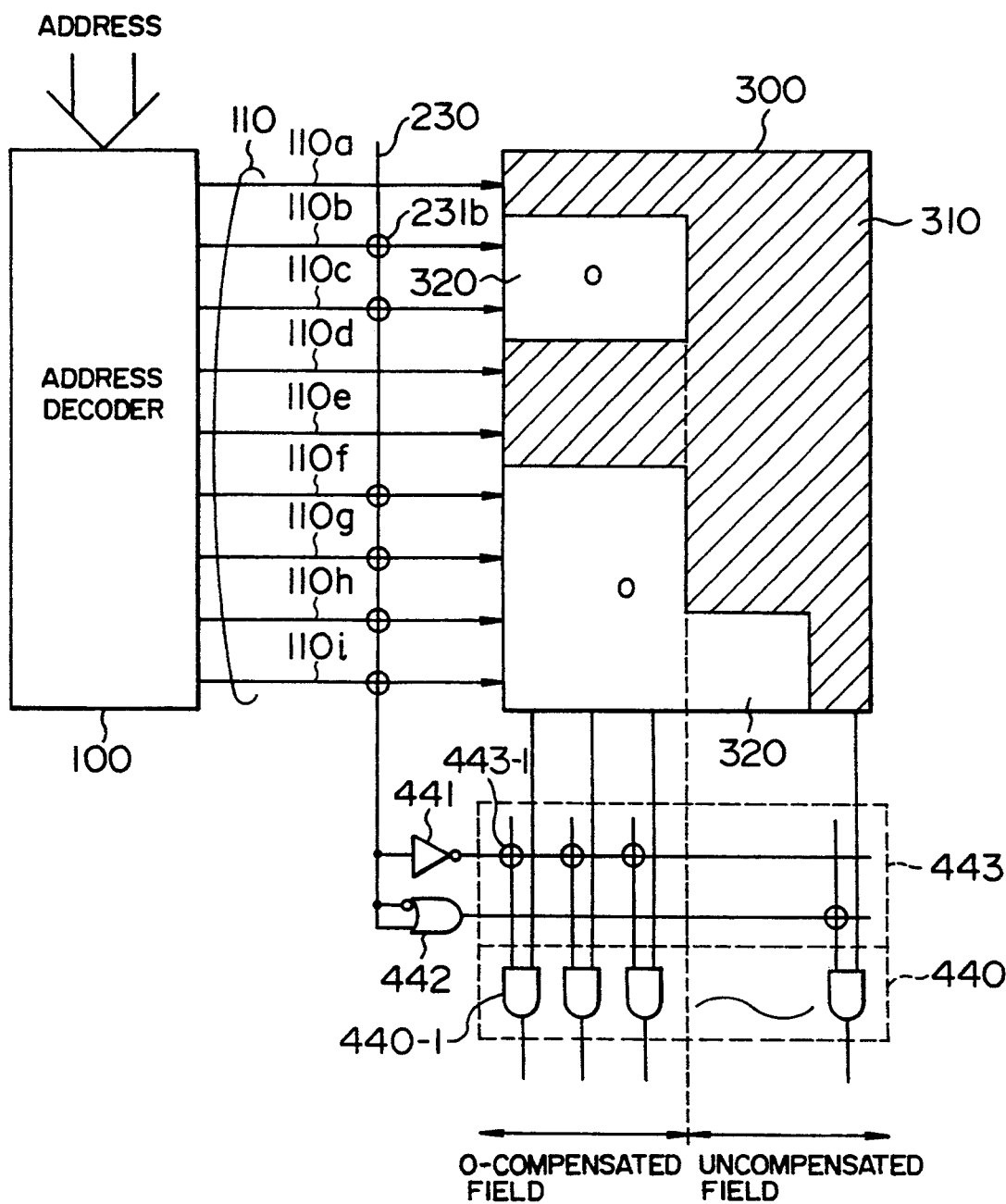
FIGS. 8 and 9 are structural views of modified embodiments of the semiconductor memory device in which division of field is programmable, respectively.

A further modified embodiment of the present invention is shown in FIG. 8. In the present embodiment, an area for which compensation is to be performed, i.e., a 0-compensated field 320 and an area for which the compensation is not performed, i.e., a non-compensated field 310 are contained in the same one word and the boundary of the both fields can be programmably set. In this embodiment, 0-compensation is performed.

Specific word lines (110*b*, 110*c*, 110*f*, 110*g*, 110*h*, 110*i*) of word lines 110 from a decoder 100 are electrically connected to a detection line 230. A gate 441, inverts the logical state of a detection signal on the detection line 230 and outputs the inverted signal to a program area 443. A gate 442 always outputs a logical value "1" to the area 443 independently of the logical value of the detection signal. A compensated field is preset in the program area 443 in association with the outputs of the gates 441 and 442. Gates 440 output fixed data corresponding to the compensated field in accordance with data stored in an accessed word area of a memory cell array 300 and the content in the program area 443 only when the compensated area is accessed.

When a desired word area including a part of a 0-compensated area 320 is accessed, the detection signal is set to be a logical value "1". The detection signal is converted into a logical value "0" by the gate 441 and is then outputted to the program area 443. A logical value "1" is always inputted to the program area 443 from the gate 442. This value may be supplied by other means such as a power source. In the program area 443, the output of the gate 441 or 442 is connected to the input of the gate 440-1 by a connection node 443-1. When the output of the gate 441 is connected to any of the gates 440 via the program area 443, a compensated field is provided and when the output of the gate 442 is connected, a non-compensated field is provided.

Accordingly, when a word area including a part of the 0-compensated area is accessed, the outputs of some of the gates 440 for the compensated field which are specified in the area 443 become bits of "0" independently of the word data read out from the memory cell array. The other outputs are contents of the word data as they are. That is, a part of the read out data is replaced by "0" bits. In other words, "0" bits are merged into the read out data. Accordingly, compensation for a defect can be carried out in a case that the defect exists in the 0-compensated field 320. The connection node 443-1 in the program area 443 may be formed as shown in FIGS. 3 and 4. The node may be of course formed of an ohmic connection of only a metal wiring in a wired-OR manner.

Figure 9:
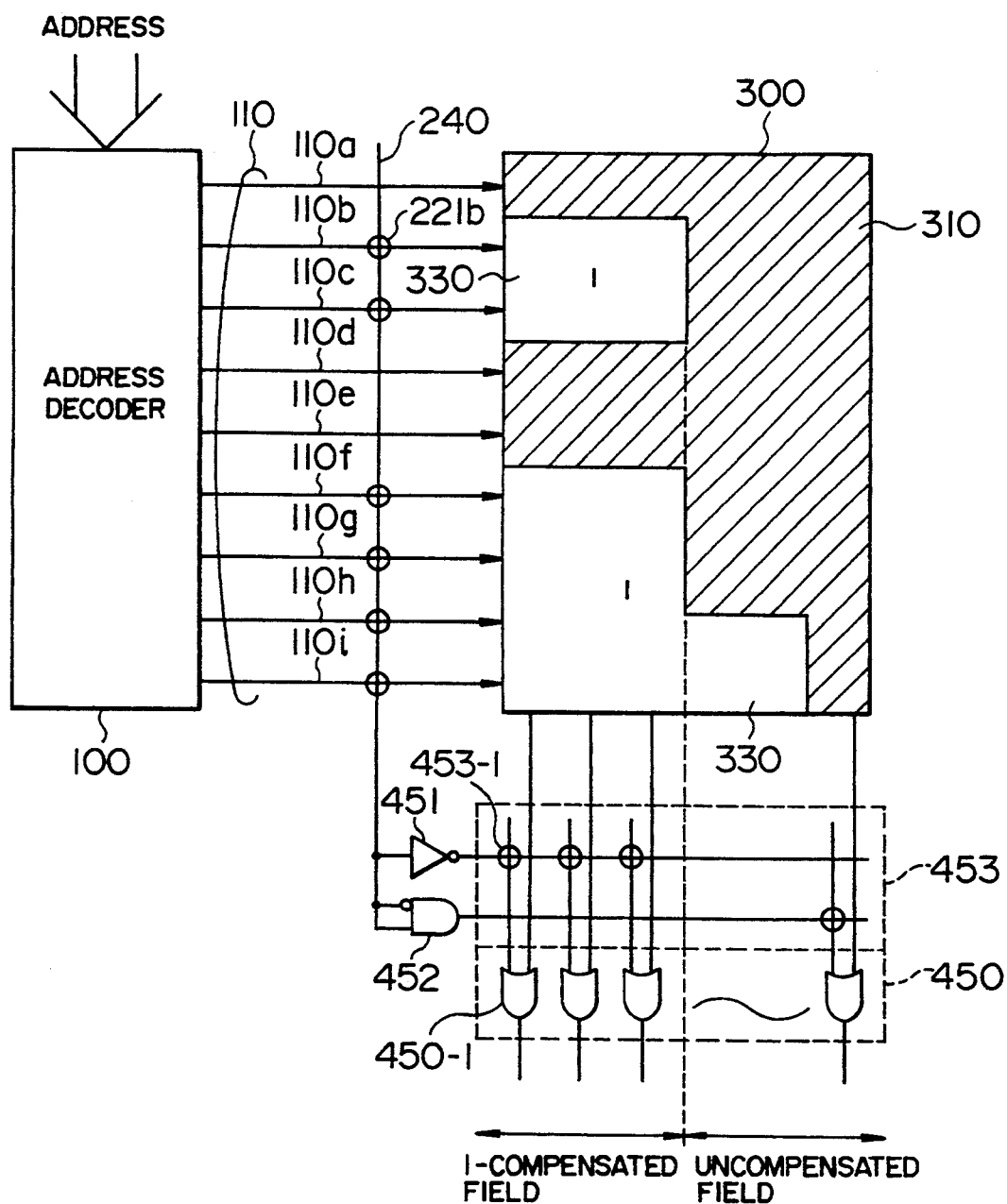

FIG. 9 is a circuit diagram showing a further embodiment in which the 0-compensated field in the embodiment shown in FIG. 8 is replaced by a 1-compensated field.

Specific word lines 110*b*, 110*c*, 110*f*, 110*g*, 110*h* and 110*i* of the word lines 110 which are connected to outputs of a decoder 100 are electrically connected to a detection line 240. A gate 451 transmits a logical state of a detection signal on the detection line 240 to a program area 453. A gate 452 always outputs a logical value "0" to the area 453 independently of the logical value of the detection signal. A compensated field is preset in the program area 453 in association with the outputs of the gates 451 and 452. Each gate 450 in the compensated field outputs fixed data corresponding to the compensated field in accordance with data stored in an accessed word area of the memory cell array 300 and a content of the program area 453 only when the compensated area is accessed.

An operation of the embodiment of FIG. 9 is identical with that of FIG. 8. Compensation for a defect can be achieved even if the defect exists in the 1-compensated field of a word area which includes a part of the non-compensated area 310.

Figure 10:
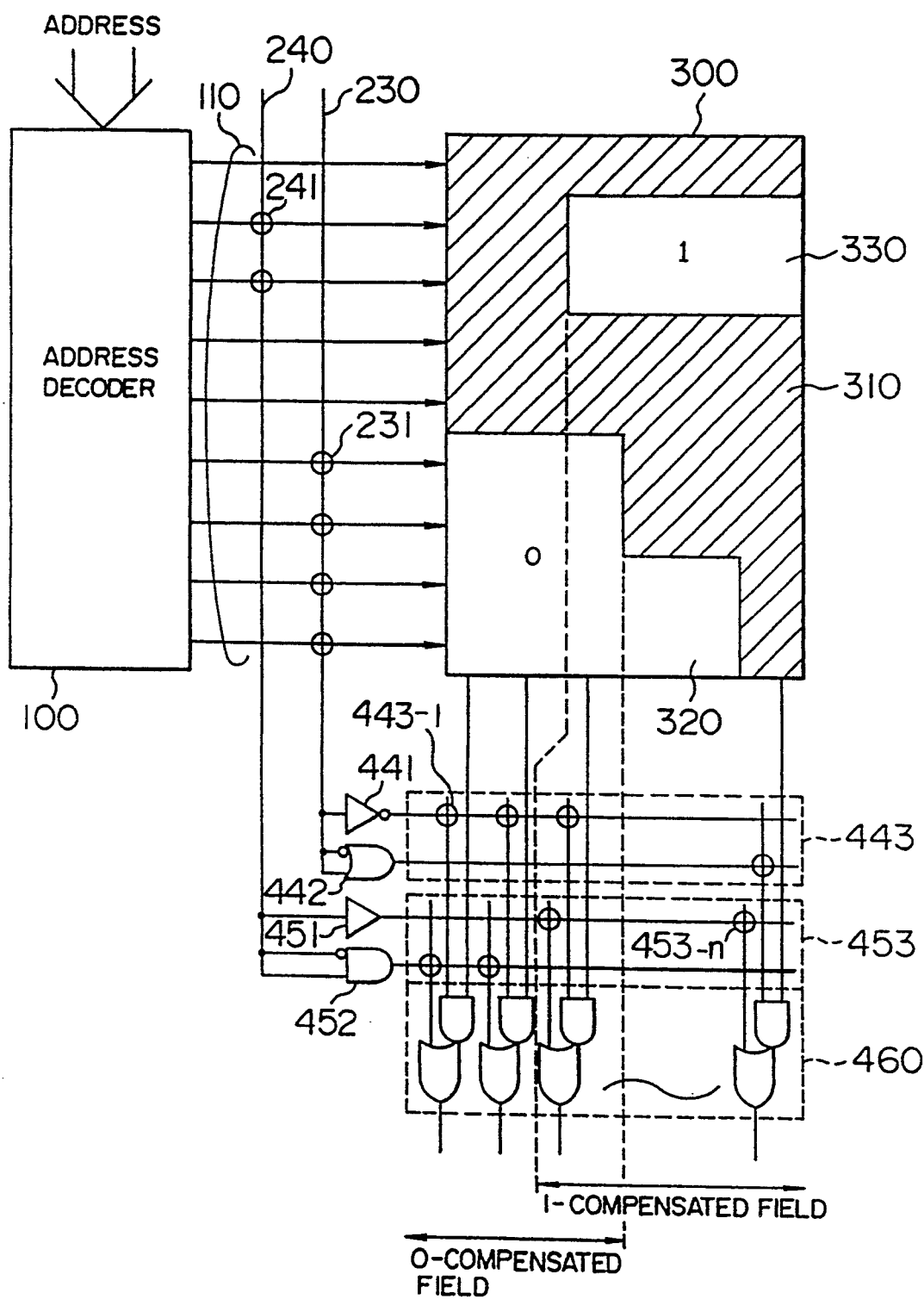
FIG. 10 is a structural view of a modified embodiment of the semiconductor memory device in which the embodiments shown in FIGS. 8 and 9 are combined.

FIG. 10 is a diagram showing an embodiment which is a combination of the embodiments of FIGS. 8 and 9 where like numerals represent like elements.

As shown in FIG. 10, complex gates 460 are used in place of the gates 440 and 450, similarly to the embodiment of FIG. 6, in order to combine in overlap the 0-compensated field similar to the embodiment of FIG. 8 and the 1-compensated field similar to the embodiment of FIG. 9.

Figure 11:
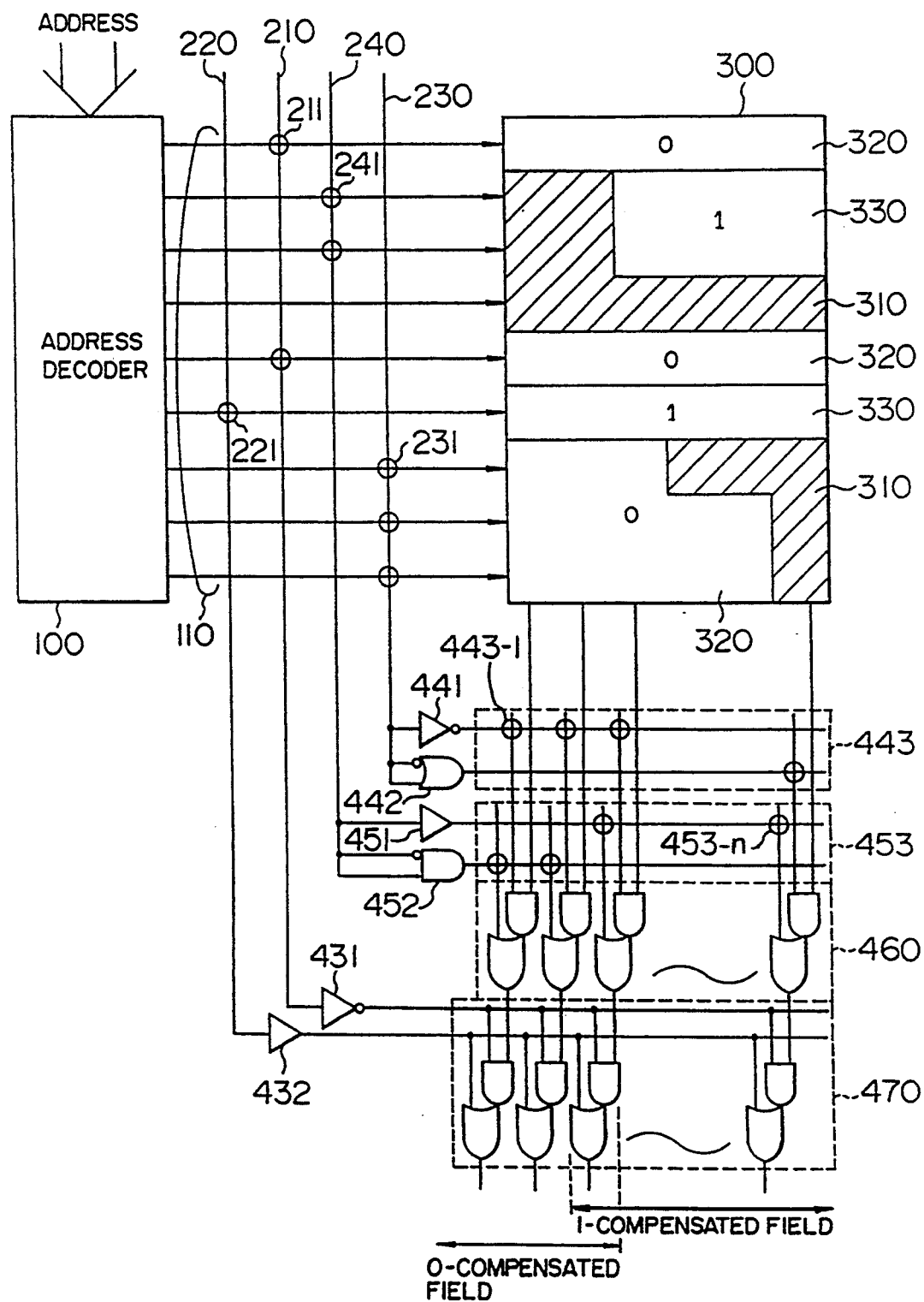
FIG. 11 is a structural view of a modified embodiment of the semiconductor memory device in which the embodiments shown in FIGS. 6 and 10 are combined.

FIG. 11 is a diagram showing an embodiment which is a combination of the concepts of the embodiments shown in FIGS. 6 and 10 where like numerals represent like elements.

As shown in FIG. 11, a multiple stage complex gate structure is adopted in which complex gates 470 are provided so that one of the inputs of each complex gate 430 shown in the embodiment of FIG. 6 is connected to the output of a corresponding complex gate 460 and receives data from a memory cell array 300 in order that the compensation of both the 0-compensated area and the 1-compensated area similar to the embodiment of FIG. 6 is combined with the compensation of both the 0-compensated field and the 1-compensated field similar to the embodiment of FIG. 10.

Figure 12:
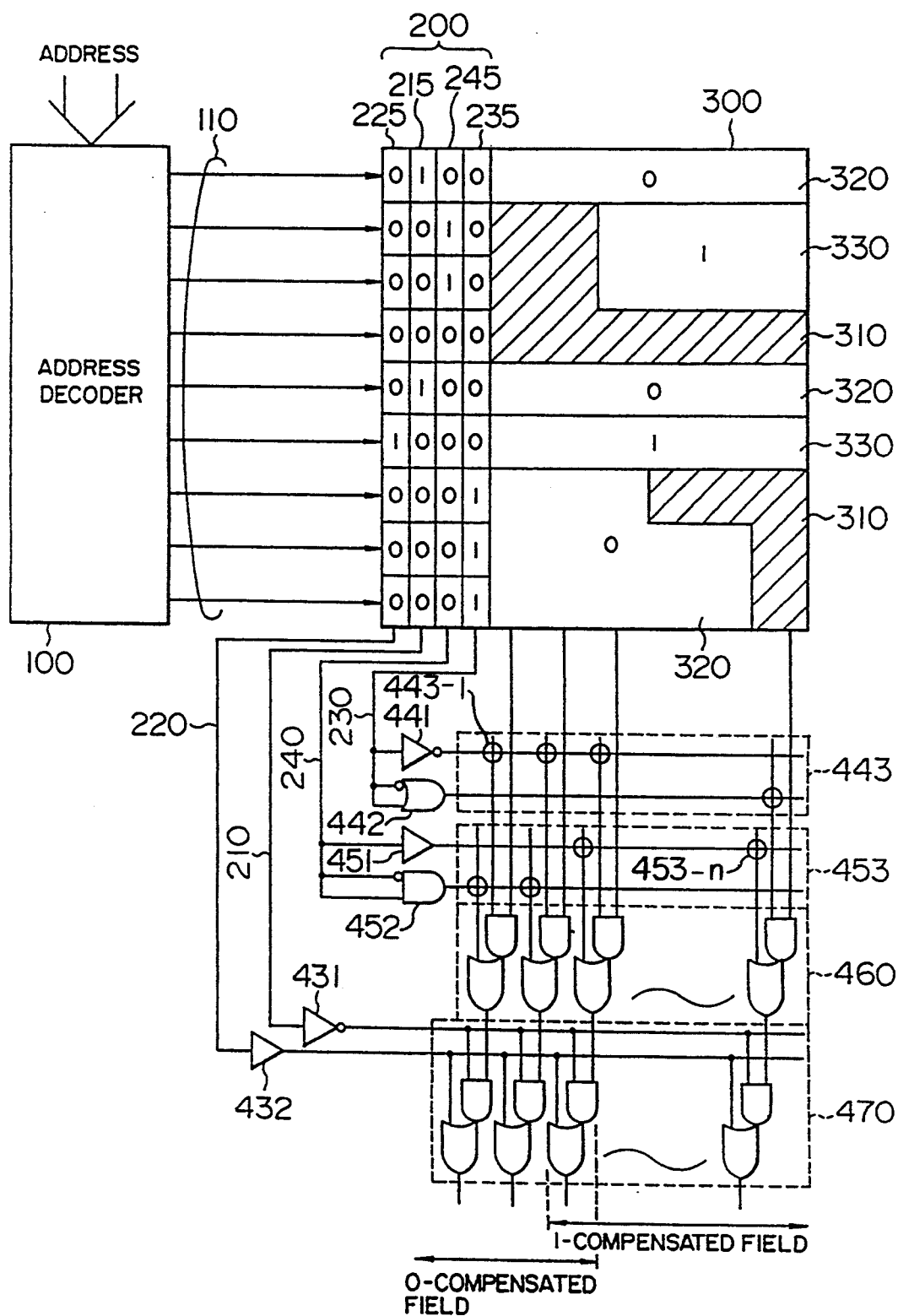
FIG. 12 is a structural view showing a modified embodiment of the semiconductor memory device in which selection detecting means includes memory cells.

FIG. 12 is a diagram showing a modification of the embodiment shown in FIG. 11 where like numerals represent like elements. The four detection lines 210, 220, 230 and 240 and the connection nodes 211, 221, 231 and 241, etc. in the embodiment shown in FIG. 11, that is, the selection detecting circuit 200 is formed in a part of the memory cell array 300. In other words, the selection detecting circuit is constructed from read only memory cells similar to the cells in the memory cell array 300. The arrangement of the compensated and non-compensated areas in the memory cell array is identical with that of FIG. 11.

As shown in FIG. 12, detection columns 215, 225, 235 and 245 are provided in place of the detection lines 210 220, 230 and 240. Data bits stored in the detection columns are read out at the same time that the memory is accessed. Means for reading out the data bits from the detection columns, such as a sense amplifier circuit is omitted from the drawing. Each data bit from the detection columns has a logic value "1" or "0" respectively representing whether or not the accessed word is present in the compensated area. These data bits are transmitted to the fixed data outputting circuit 400 without being converted.

In accordance with the present invention, effects which are same as those of the above mentioned embodiment shown in FIG. 11 can be readily obtained by slightly increasing the bit width of the memory cell array. The word line selection detecting circuit 200 may be provided at a desired portion in the memory cell array and alternatively may be provided in the outside of the memory cell array.

Figure 13:
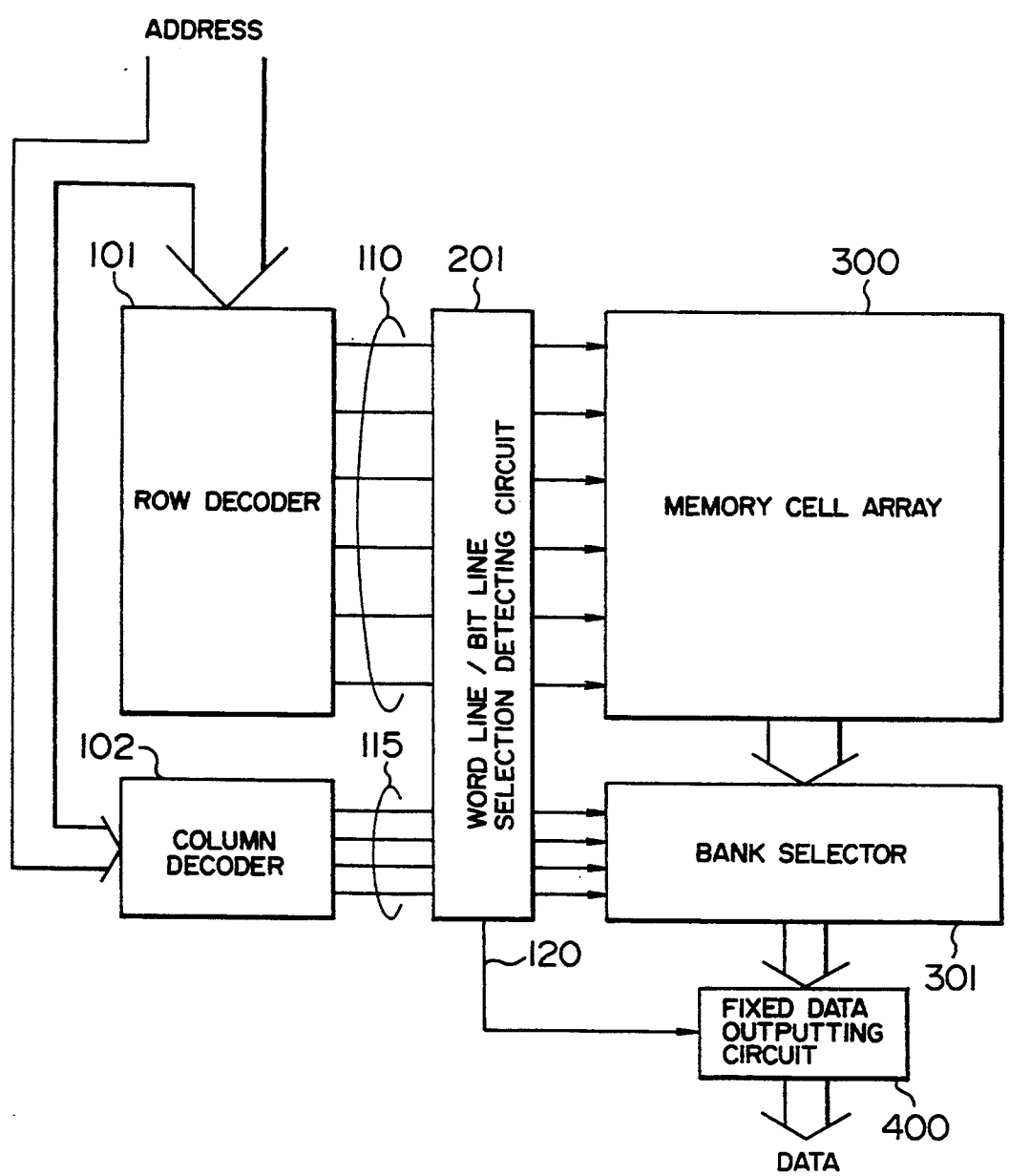
FIG. 13 is a structural view showing a modified embodiment of the semiconductor memory device having both row and column decoders.

FIG. 13 is a diagram showing an embodiment in which an address decoder includes a row decoder 101 and a column decoder 102. As shown in FIG. 13, upper 8 bits and lower 4 bits of an address of, for example, 12 bits are supplied to the row decoder 101 and the column decoder 102, respectively and decoded thereby. The outputs of the row decoder 101 and the column decoder 102 appear on word lines 110 and bit lines 115, respectively. The data which has been stored in the memory cell array 300 is read out in accordance with a combination of signals on the word line 110 and the bit line 115. Accordingly, a word line/bit line selection detecting circuit 201 is provided to combine the word line 110 and the bit line 115 for detecting access to the compensated area. The bank selector 301 selects a bank or a bit from among the plurality of data bits of the word selected by the selection detecting circuit 201. A result of the detection is transmitted to a fixed data outputting circuit 400 via the detection signal line 120 to conduct compensation for a defect.

In accordance with the present embodiment, the same effects as those of the afore-mentioned embodiments can be obtained even if the address decoder includes row and column decoders.

Figure 14:
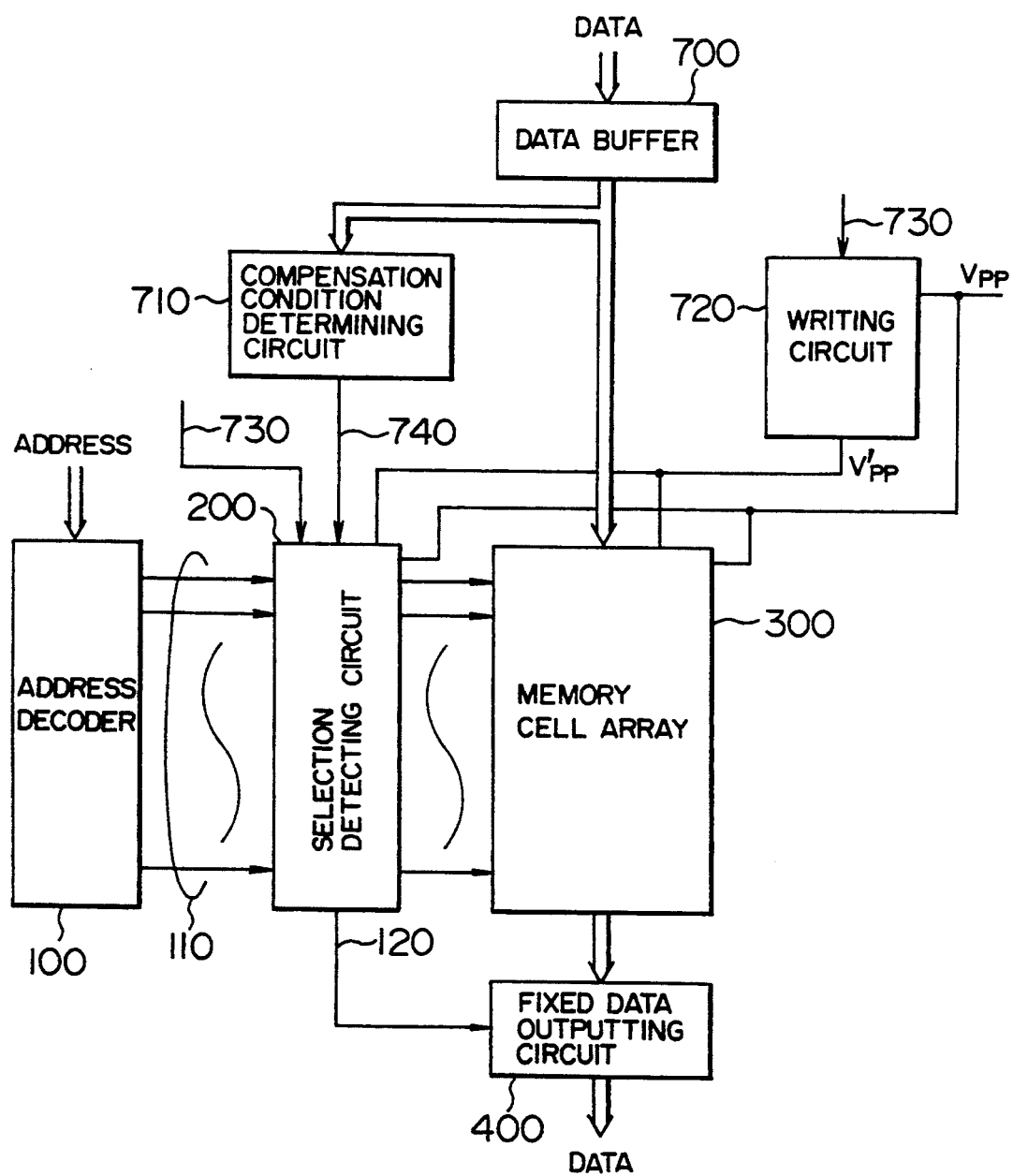
FIG. 14 is a structural view of a modified embodiment of the semiconductor memory device which uses an electrically programmable memory cell array.

FIG. 14 is a diagram showing an embodiment in which a cell array of an electrically erasable EPROM is used as a memory cell array 300. Although a selection detecting circuit 200 is constructed as a part of an EPROM as well as the memory cell array 300, either one of the array 300 and the circuit 200 may be constructed as an ordinary ROM, e.g., a mask ROM. As shown in FIG. 14, in accordance with the present invention, there are additionally provided a writing circuit 720 for converting a high voltage $V_{pp}$ into a writing control high voltage $V'_{pp}$ when writing is performed into the EPROM which forms the array 300 and the circuit 200 in response to data latched in a data buffer 700 and a writing control signal 730, and a compensation condition determining circuit 710 which determines correspondence or coincidence between a preset compensation condition and the data latched in the data buffer 700 to output a compensation condition establishing signal to the circuit 200.

In the present embodiment, a state in which the writing control signal 730 is set to be a logical value "1" is assumed as a writing state of data into the memory cell and a state in which the signal 730 is set to be a logical value "0" is assumed as a data reading state. The writing circuit 720 generates a writing control high voltage $V'_{pp}$ which is obtained by dividing a high voltage $V_{pp}$ when the control signal 730 is set to be a logical value "1", i.e., in the writing state and supplies it to the circuit 200 and the array 300. When the control signal 730 is set to be a logical value "0" i.e., in the reading state the circuit 720 does not output the high voltage $V'_{pp}$. The array 300 writes data held in the data buffer 700 into an address selected by the word line by using the high voltage $V_{pp}$ and $V'_{pp}$.

On the other hand, the determining circuit 710 holds a data pattern as the compensation condition and compares it with a pattern of the data latched in the data buffer. More specifically, the determining circuit 710 includes comparators, the number of which is same as the number of the bits of the data supplied from the data buffer 700, and an AND circuit which operates a logical product of the outputs of these comparators. The AND circuit outputs the condition establishing signal 740. Information of each bit of the data supplied from the data buffer 700 is inputted to one of the inputs to each comparator and information of each bit of the data pattern as the preset compensation condition is inputted to the other input of each comparator. The data pattern as the compensation condition is set to be all "0" bits, for example, if the compensation is performed for the 0-compensated area as mentioned in the above embodiments. When all the data bits supplied from the data buffer 700 coincide with the bits of the data pattern as the compensation condition, each of the comparators detects the coincidence. Therefore, the establishing signal 740 is outputted to the selection detecting circuit 200. When the selection detecting circuit 200 is in the state of data writing and the establishing signal 740 is enabled, information on connection node between the detection line and the word line selected by the address decoder 100 is written by using $V_{pp}$ and $V'_{pp}$.

FIG. 15 is a diagram showing the structure of the selection detecting circuit 200 in FIG. 14 which forms a connection node between the decoding result output line, i.e., word line 110 and the detecting line 210. In the data writing state, the control signal 730 is at a logical value "1" and a gate transistor 283 is turned ON. When the word line 110 in the drawing is selected in this state, the output of the AND gate 281 is brought into a logical value "1" so that a gating transistor 282 is turned ON, resulting in that the high voltage $V_{pp}$ is applied to the gate of an EPROM memory cell 270. When the compensation condition is established so that the establishing signal 740 becomes a logical level "1", the gating transistor 280 is rendered conductive. Accordingly, the high voltage $V'_{pp}$ is applied to the drain of the EPROM memory cell 270 via the gating transistor 283. This causes electrons to be trapped in a floating gate of the EPROM memory cell 270 so that the connection between the word line and the detection line can be programmed.

Since the control signal 730 is set to be a logical level "0" in the reading out state, the transistors 284 and 285 are turned ON while the transistors 282 and 283 are turned OFF. When the word line 110 in the drawing is selected by an access to the ROM cell array 300, a current will flow to the gate of the EPROM memory cell 270 via the transistor 285 so that the gate potential becomes high. Since the transistor 286 is rendered conductive simultaneously with this, the charge of the detecting line 210 which has been precharged to a potential $V_{cc}$ flows to the drain of the EPROM memory cell 270 through the transistors 286 and 284.

If the EPROM memory cell 270 has been programmed to "1", that is, electrons are trapped in the floating gate, the EPROM memory cell 270 is not turned ON even when a gate bias voltage is applied. Accordingly, the potential of the detection line 210 is kept. This means an access to the compensated area. FIG. 15 shows a case in which the 0-compensated area is specified. The logical value of the detection line 210 is inverted to provide the detection signal with the inverted logical value. If the EPROM memory cell 270 has been programmed to "0", that is, electrons are not trapped in the floating gate, the EPROM memory cell 270 is turned ON. Accordingly, an electric charge is discharged from the detecting line 210 to lower the potential. This means an access to the non-compensated area.

In accordance with the present embodiment, it is possible to preset the compensated area simultaneously with writing of the data into the EPROM memory cell array. In addition, according to the present embodiment, it is possible to preset the compensated area after manufacturing of the semiconductor memory device. Therefore, users can preset the compensated areas.

Figure 16:
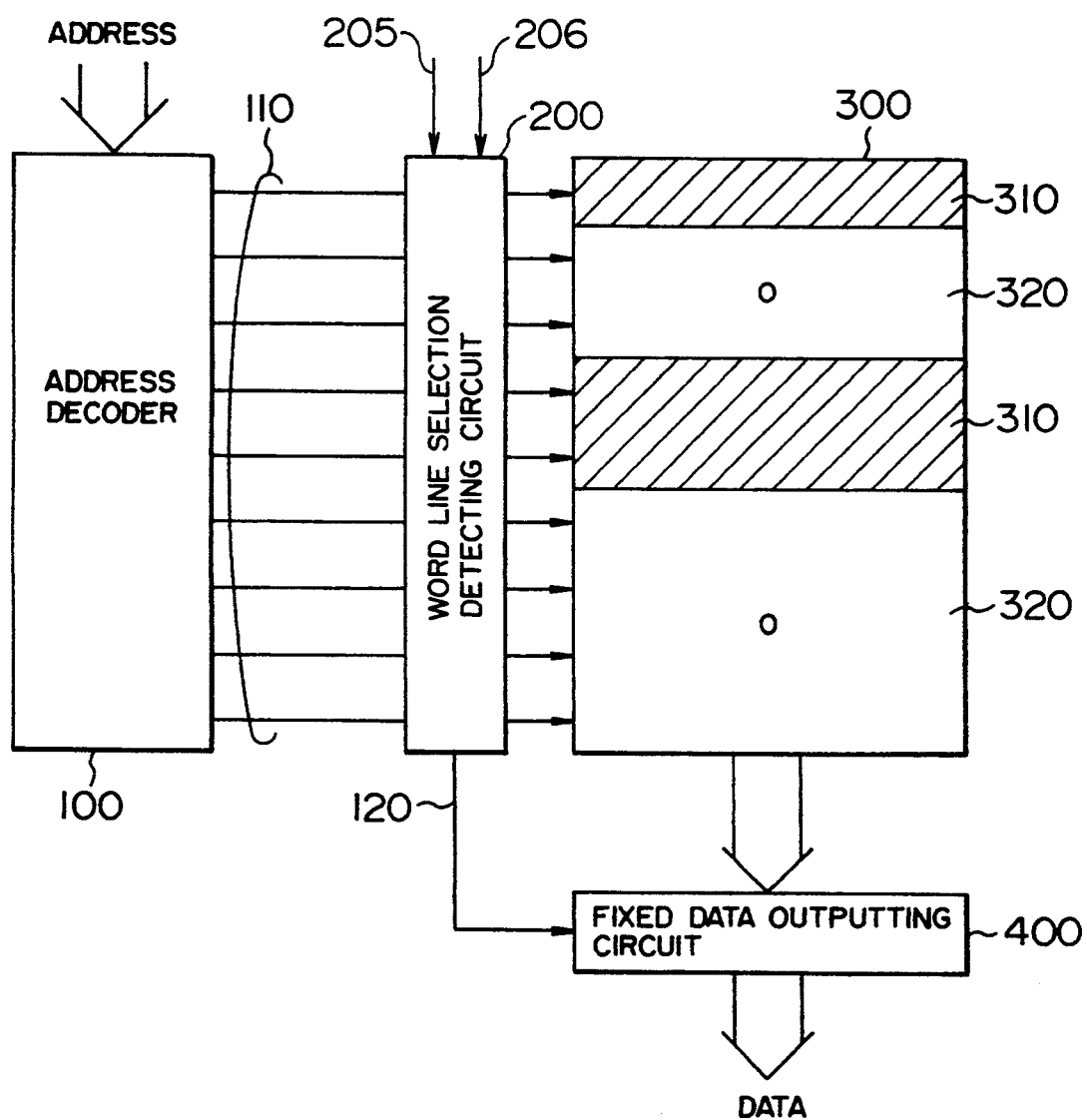
FIG. 16 is a structural view of a modified embodiment of the semiconductor memory device in which the selection detecting means is programmable.

FIG. 16 is a diagram showing an embodiment in which connection between decoded result outputting lines 110 and detection lines 210 is programmable. A connection pattern control signal 205 and a connection pattern clear signal 206 are inputted to the selection detecting circuit 200.

Figure 17:
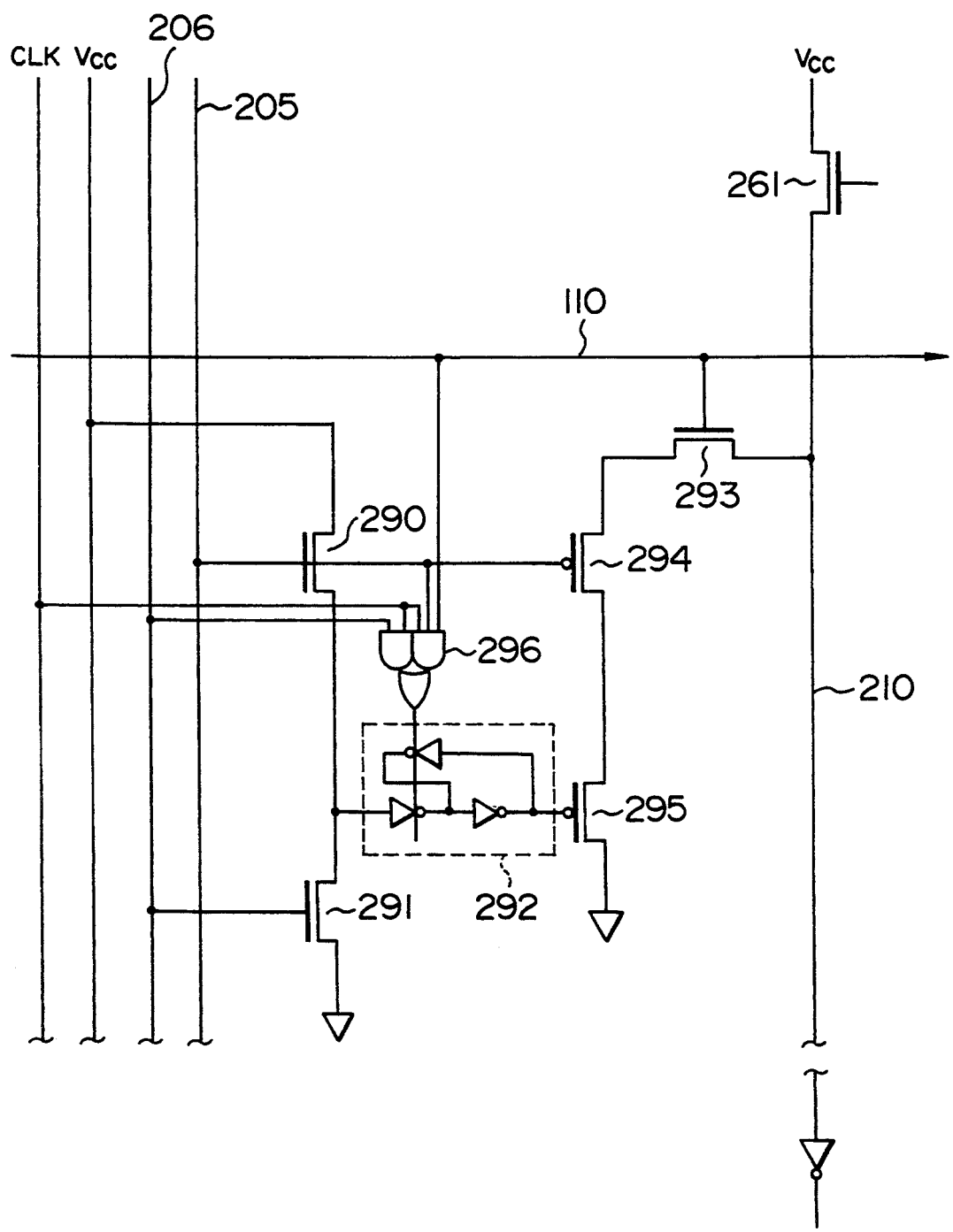
FIG. 17 is a view showing the structure of the selection detecting means.

FIG. 17 is a diagram showing the structure of the selection detecting circuit 200 shown in FIG. 16. The circuit 200 is brought into a writing state for enabling to write information on connections between the word lines and detection lines by bringing the signal 205 into "1", and is brought into a reading state for enabling to read the memory cell array 300 by bringing the signal 205 into "0".

Since the gating transistor 290 is turned ON in the writing state, a logical value "1" is latched into the latch 292 from a power supply $V_{cc}$ via the gate 296 in synchronization with a clock signal when the word line 110 in the drawing is selected by an access to the ROM cell array 300. At this time, writing of the data into the memory cell array is not conducted.

The gating transistor 294 is turned ON in the reading state. When the word line 110 in the drawing is selected by an access to the ROM cell array 300, the gating transistor 293 is rendered conductive and the charge of the detecting line 210 which has been precharged to a potential $V_{cc}$ will flow to the drain of the gate transistor 295 through the transistors 293 and 294.

When a logical value "1" has been programmed in the latch 292, the potential of the detection line 210 is kept since the transistor 295 is turned OFF. This means an access to the compensated area.

When a logical value "0" has been programmed in the latch 292, the charge is discharged from the detection line 210 to lower the potential since the transistor 295 is turned ON. This means an access to a non-compensated area. All the latches associated with each word line can be reset in synchronization with a clock signal by rendering the clear signal 206 enable.

In accordance with the present invention, compensation for a defect can be realized by the number of elements fewer than that of prior art since an access to a compensated area can be detected from the decoded result output lines. The size and the number of compensated areas is not restricted since a compensated area can be selected in unit of decoded output (for example, each word) of the address decoder. Flexibility of selection of the compensated area can be further increased by a structure of fixed value outputting circuit.

Now, a second embodiment of a semiconductor memory device of the present invention will be described.

Figure 18:
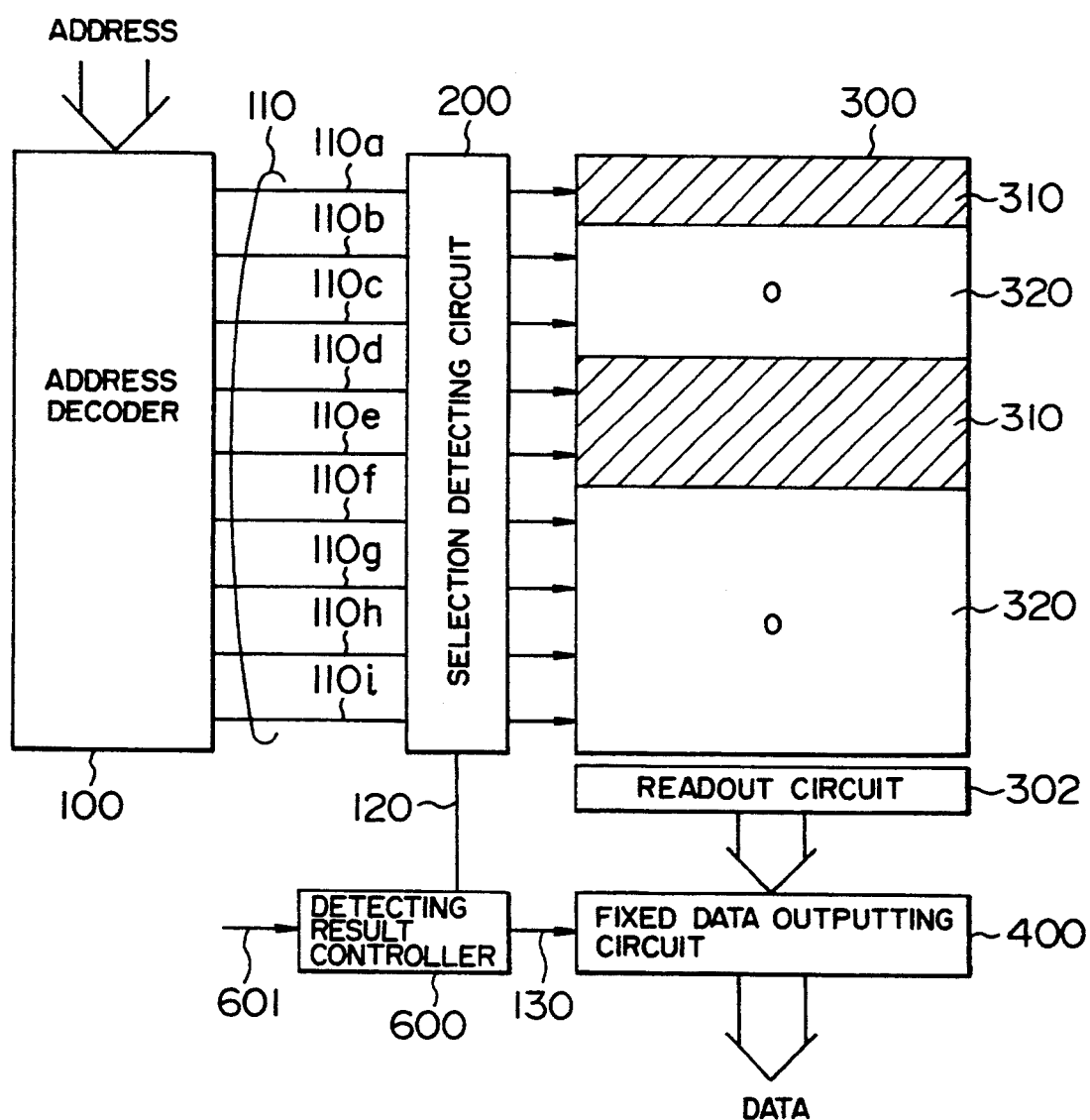

The structure of the semiconductor memory device of the second embodiment is shown in FIG. 18. In the present embodiment, a detecting result controller 600 is added to the first embodiment of FIG. 1. Accordingly, differences between the first and second embodiments will be mainly described. A detecting result by a selection detecting circuit 200 is fed to a detecting result controller 600 via a detection signal 120 and fed to a fixed data outputting circuit 400 via a control line 130 only when the control signal on a control line 601 indicates that the detection signal is valid. As a result of this, given fixed data is forcedly outputted depending upon the logical value of the compensated area. That is, a detection signal representative of a detection result obtained by the circuit 200 is transmitted to the controller 600 via the signal line 120. When the control signal on the control line 601 indicates that the detection result is valid, i.e., compensating means is used, the detection signal is transmitted to the circuit 400 via the control line 130. At this time all bits "0" are outputted from the circuit 400 independently of real contents from the memory cell array 300, i.e. information really stored in a compensated area 320. When the control signal on the control line 601 indicates that the detection result is invalid, i.e., compensating means is not used, or when any of addresses of a non-compensated area 310 is accessed, the circuit 400 outputs the content of the memory cell array 300 read out via a read out circuit (sense amplifier) 302, e.g., information really stored in the memory cell array 300 without changing it. The logical value of the control signal is controlled by an interface signal of a memory module or through a pin of a memory chip.

In accordance with the present embodiment, it is possible to read out contents in the real memory cell array, that is, information really stored in the compensated area 320 in response to the control signal even if the compensating means is used. In other words, even when a defect exists in the compensating means and, for example, the detection signal from the circuit 200 is defective, the detection result can be made invalid by the control signal if there is no defect in the memory cell array 300. Enhancement of yield of the semiconductor memory device can be achieved.

The embodiment will be described in more detail with reference to FIG. 19. In this embodiment, a detecting result controller 600 is added to the embodiment shown in FIG. 2. The detection signal representative of an access to a compensated area is controlled by an AND gate 610 in response to a control signal on a control line 601. When the control signal represents that the detecting result is valid, i.e., a logical value "1" the logical value "1" of the detection signal passes through the gate 610 and is supplied to one of inputs of an AND gate 410 as a logical value "0" by an inverting gate 411.

On the other hand, when any of the addresses of the non-compensated area 310 is accessed, the detecting signal is asserted to a logical value "0" since the word lines 110b, 110c, 110f, 110g, 110h and 110i are all at a logical value "0". Since a logical value "1" is inputted to the gates 410 even when the control signal on the control line 601 represents that the detecting result is valid, i.e., a logical value "1" the data read out from the memory cell array 300 is outputted without being changed. Since a logical value "1" is always supplied to the gates 410 independently of the logical value of the detection signal if the control signal represents that the detecting result is invalid, i.e., a logical value "0", the data read out from the memory cell array 300 is outputted without being changed. In such a manner, even if a defect exists in the compensating means, the defect can be made invalid. If there is no fault in the data stored in the memory cell array 300, this data could be used.

Connection patterns 211 between the word lines 110 and the detection line 210 as shown in FIG. 19 are identical with those of FIG. 3. Of course, the other structure may be adopted as the connection pattern shown in FIG. 4.

In accordance with the present embodiment, a slight increase in the number of elements enables to turn on or off a defect compensating function in a semiconductor memory device having a defect compensation capability. This makes it possible to read out the content of the compensated area in a case that compensation means is not used. This means that either one of doubled outputs having no relation to a defect can be selectively outputted. Accordingly, even if a defect occurs in the compensating means, further increase in a yield can be achieved by using a subjective memory area if it has no defect. Detection of validity of the compensating means can be made easy due to a fact that the content in the compensated area can be really read out. Trade off between overhead of area and effect of increase in a manufacturing yield can be achieved by the introduction of the compensating means.

Figure 20:
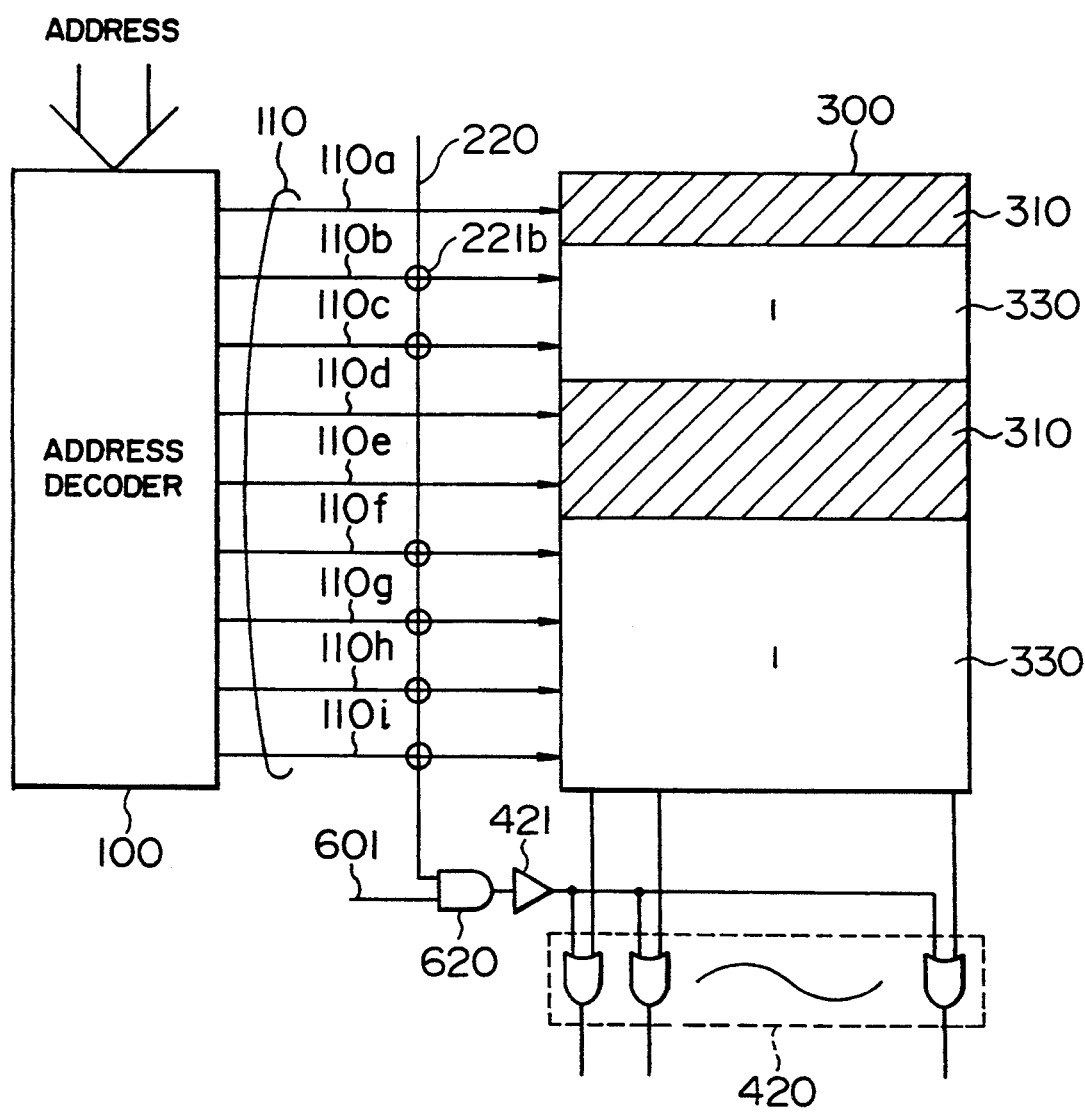
FIG. 20 is a structural view of an embodiment of a semiconductor memory device which is a modification of the embodiment shown in FIG. 19.

An embodiment in which a detecting result controller is added to the embodiment shown in FIG. 5 is shown in FIG. 20. That is, in the present embodiment, a semiconductor memory device having a capability of compensating for a defect in an area including only "1" bits in a memory cell array 300 is provided with a detecting result control line 601 and an AND gate 620 serving as a detecting result controller.

An operation of the present embodiment is substantially identical with that of the embodiment of FIG. 19. Fixed "1" bit data are outputted from OR gates 420 only when the compensated area is accessed in a state that the detecting result is made valid. When invalidity of the detection result is specified by a control signal, the data read out from the memory cell array 300 can be normally outputted without being changed.

Figure 21:
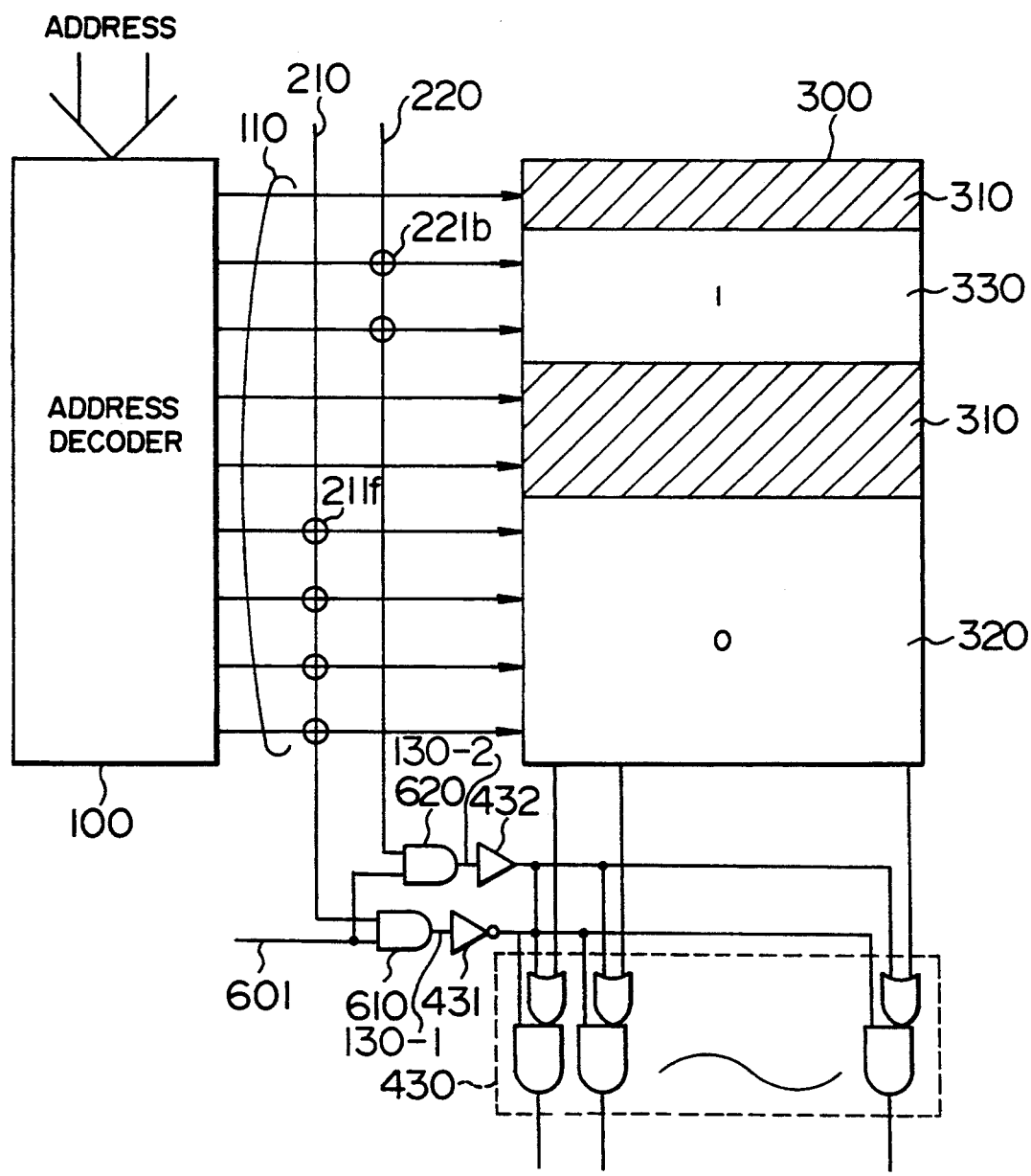
FIG. 21 is a structural view of a modified embodiment of the semiconductor memory device in which the embodiments shown in FIGS. 19 and 20 are combined.

Another modified embodiment of the present invention in which two embodiments of FIGS. 19 and 20 are combined is shown in FIG. 21. In this embodiment, the semiconductor memory device is provided with a detecting result control line 601 and AND gates 610 and 620 serving as a detecting result controller. The detection signals on the detection lines 210 and 220 are controlled by the gates 610 and 620 in accordance with the control signal on the control line 601 and are supplied to the gates 431 and 432, respectively. Also in the present embodiment, data read out from the memory cell array 300 can be normally outputted as it is if invalidation of the detecting result is specified by the control signal.

Figure 22:
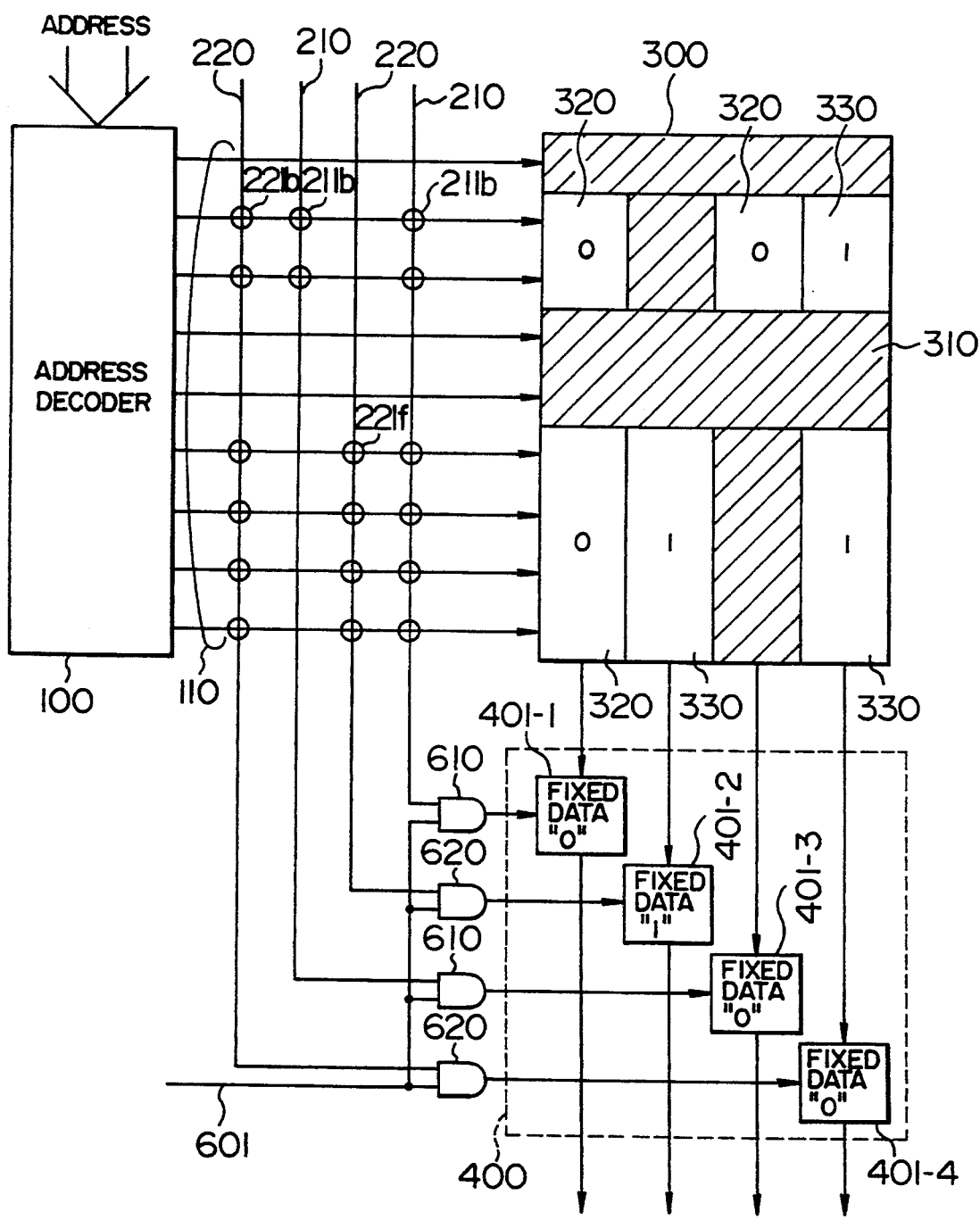
FIG. 22 is a structural view of a modified embodiment of the semiconductor memory device.

A further embodiment in which a detecting result controller is added to the embodiment of FIG. 7 is shown in FIG. 22. In this embodiment, an semiconductor memory device is provided with a detecting result control line 601 and AND gates 610 and 620 serving as a detecting result controller. Detection line 210 or 220, gates 610 and 620 for controlling the logical values of detection signals of the detection lines 210 and 220 in accordance with a control signal a detecting result control line 601, respectively and a fixed data outputting circuit 400 are provided in correspondence with respective fields.

In accordance with the present embodiment, presetting of compensation and non-compensation and presetting of fixed data on compensation are possible in unit of each field which is obtained by dividing output data into a plurality of fields. A slight increase in the number of elements enables to turn on or off an defect compensating function in a semiconductor memory device having such a capability. This makes it possible to read out the content of the compensated area in a case that compensating means is not operated. This means that either one of doubled outputs having no relation to a defect can be selectively outputted. Accordingly, even if a defect occurs in the compensating means, a further increase in a manufacturing yield can be achieved by using a subjective memory area if it has no defect. Detection of validity of the compensating means is made easy due to a fact that the content in the compensated area can be really read out. Trade off between overhead of area and effect of increase in the manufacturing yield can be achieved by the introduction of the compensating means.

Figure 23:
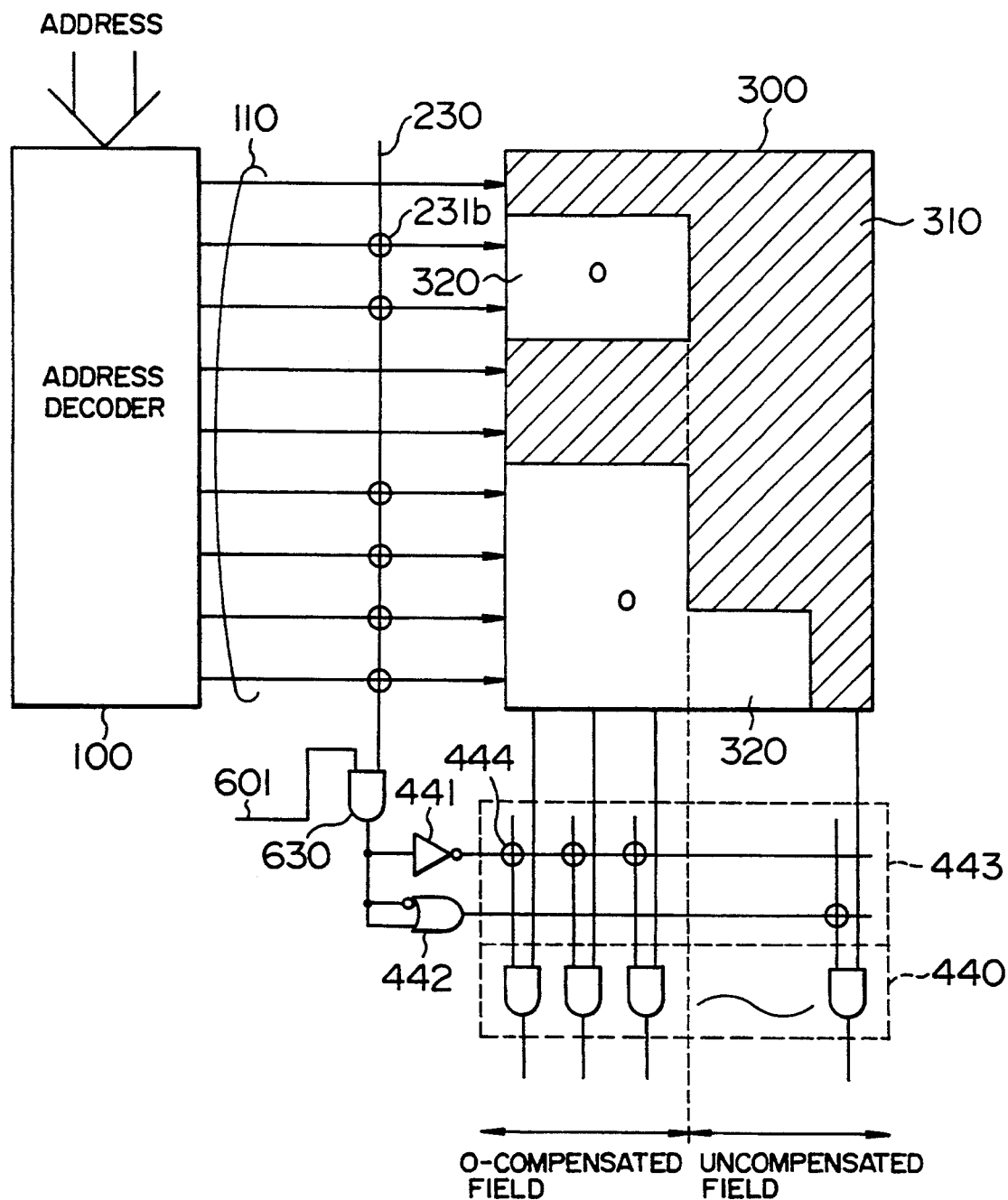
FIGS. 23 and 24 are structural views of a modified embodiment of the semiconductor memory device in which division of field is programmable.

A further embodiment in which a detecting result controller is added to the embodiment shown in FIG. 8 is shown in FIG. 23. In this embodiment, the semiconductor memory device shown in FIG. 8 is provided with a detecting result control line 601 and an AND gate 630 serving as a detecting result controller. The detection signal on a detection line 230 is controlled by the gate 630 in response to a control signal on a control line 601 and is supplied to gates 441 and 442.

In accordance with the present embodiment, a compensated field and a non-compensated field may be included in one word and the division of both fields may be made programmable. A slight increase in the number of elements enables to turn on or off a defect compensating function in such a semiconductor memory device. This makes it possible to read out the content of the compensated area in a case that compensating means is not used. This means that either one output of doubled outputs having no relation to a defect can be selectively outputted. Accordingly, if a defect occurs in the compensating means, a further increase in a manufacturing yield can be achieved by using a subjective memory area if it has no defect. Detection of validity of the compensating means is made easy due to a fact that the content in the compensation area can be really read out. Trade off between overhead of area and effect of increase in the manufacturing yield can be achieved by the introduction of the compensating means.

Figure 24:
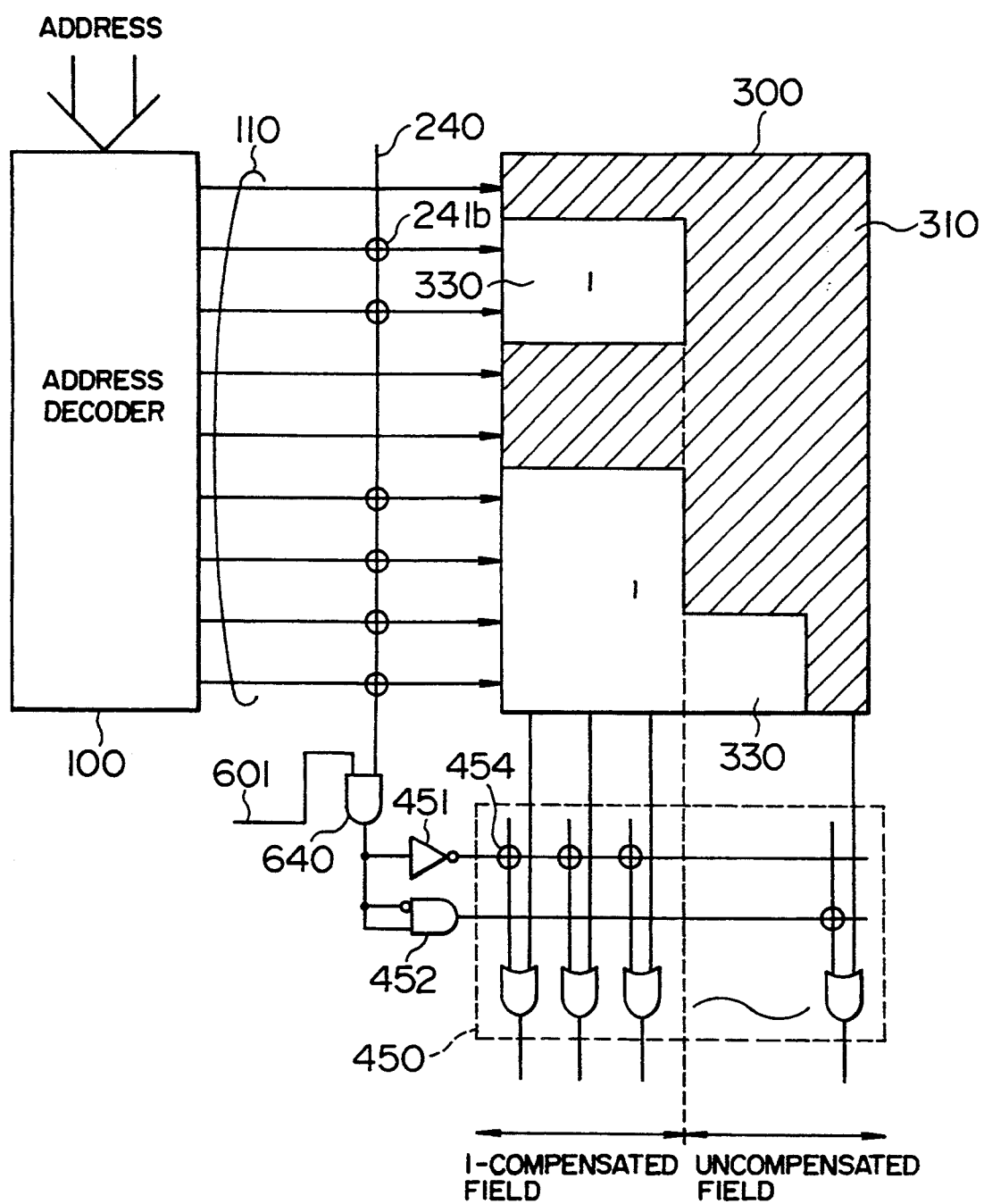

FIG. 24 is a diagram showing an embodiment of a semiconductor memory device in which the 0-compensated field in the embodiment shown in FIG. 23 is replaced with the 1-compensated field. In this embodiment, a detecting result controller is added to the embodiment shown in FIG. 9. As is similar to the embodiment shown in FIG. 23, a detecting result control line 601 and an AND gate 640 serving as a detecting result controller are provided to realize operation of the present invention.

Figure 25:
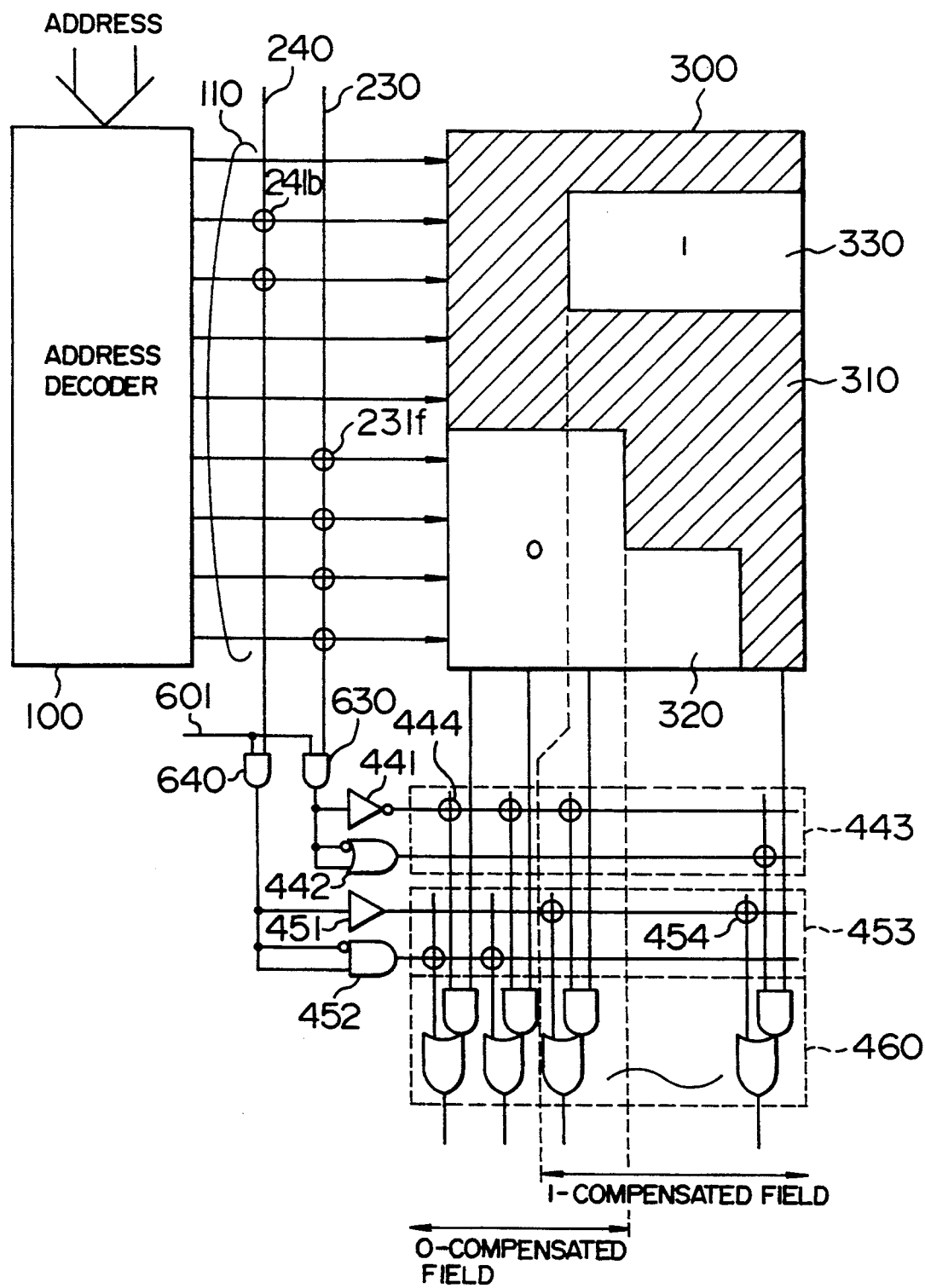
FIG. 25 is a structural view of a modified embodiment of the semiconductor memory device in which the embodiments shown in FIGS. 23 and 24 are combined.

FIG. 25 is a diagram showing an embodiment in which the embodiments shown in FIGS. 23 and 24 are combined and a detecting result controller is added to the embodiment shown in FIG. 10. A detecting result control line 601 and AND gates 630 and 640 serving as detecting result controller are provided to realize operation of the present invention.

Figure 26:
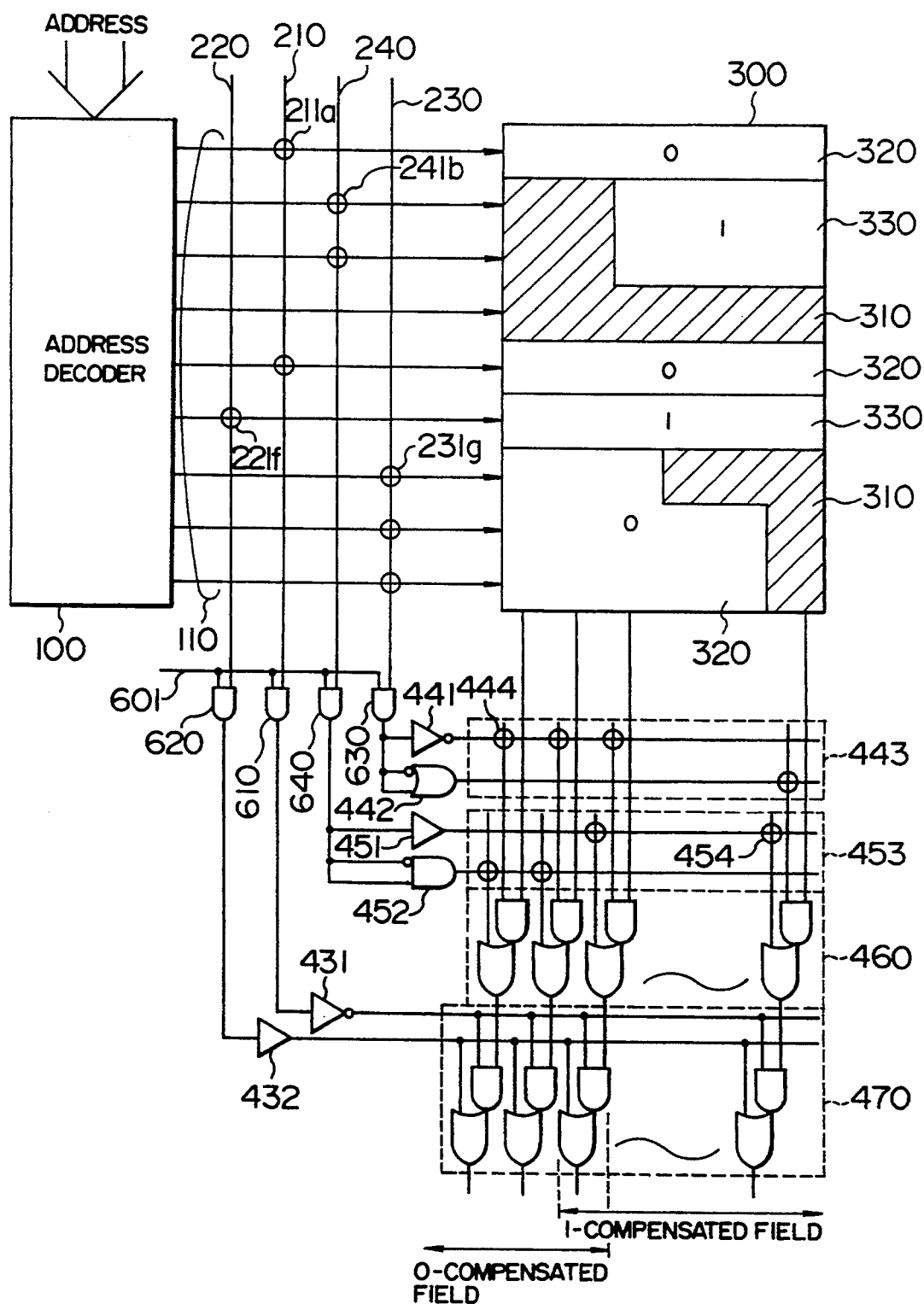
FIG. 26 is a structural view of a modified embodiment of the semiconductor memory device in which the embodiments shown in FIGS. 21 and 25 are combined.

FIG. 26 is a diagram showing an embodiment in which the embodiments shown in FIGS. 21 and 25 are combined and a detecting result controller is added to the embodiment shown in FIG. 12. A detecting result control line 601 and gates 610, 620, 630 and 640 serving as the detecting result controller are provided to realize operation of the present invention.

Figure 27:
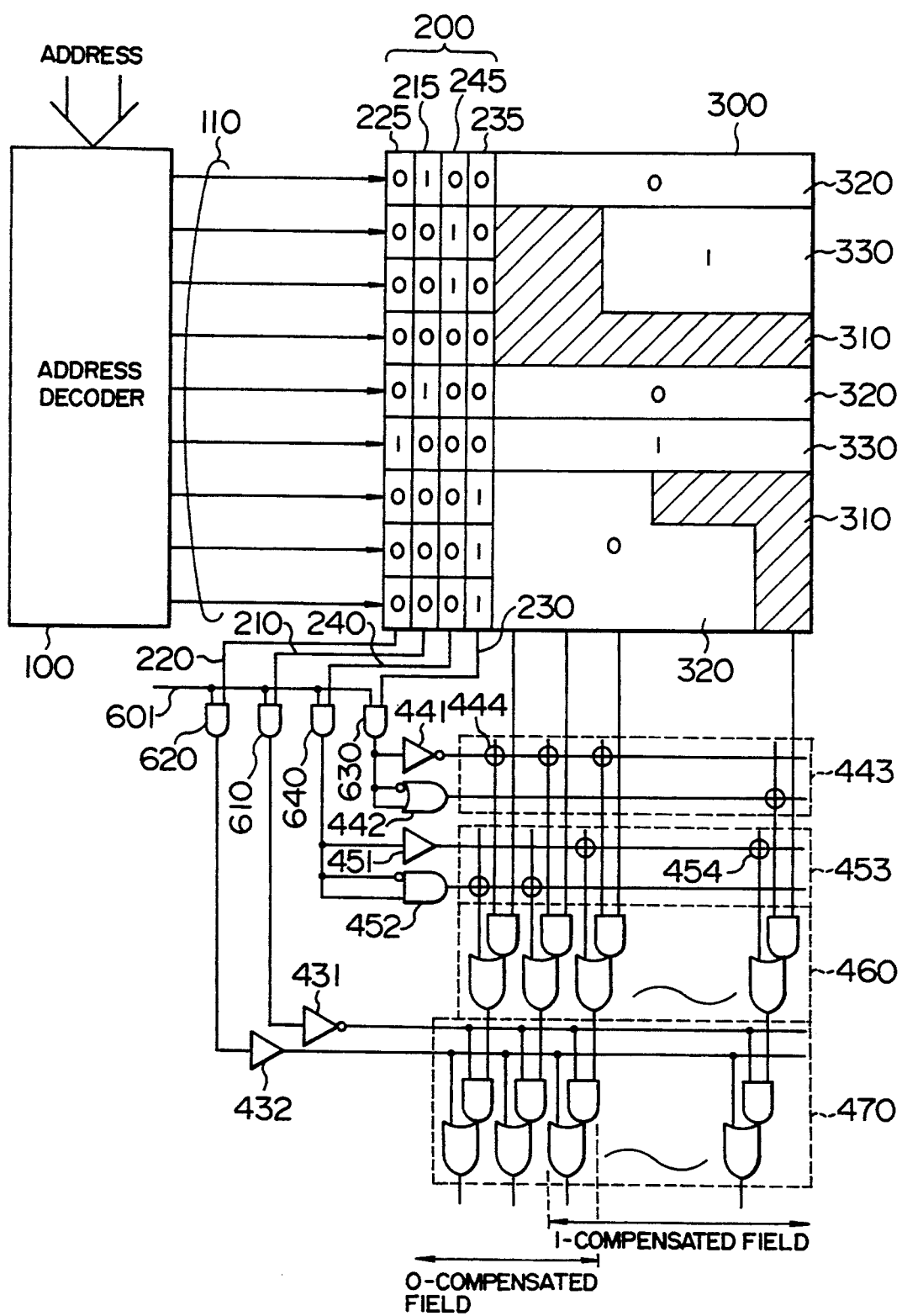
FIG. 27 is a structural view of a modified embodiment of the semiconductor memory device in which the selection detecting means comprises memory cells.

FIG. 27 is a diagram showing an embodiment which is a modification of the embodiment shown in FIG. 26. A detecting result controller is added to the embodiment shown in FIG. 12. The semiconductor memory device shown in FIG. 26 is provided with the control line 601 and AND gates 610, 620, 630 and 640 serving as the detecting result controller.

Detected column data are transmitted via detection lines 210, 220, 230 and 240 to the gates 610, 620, 630 and 640, respectively which form the detecting result controller connected to the control line 601. Outputs of the gates 610, 620, 630 and 640 are then transmitted to the fixed data outputting circuit.

As mentioned above, in accordance with the present embodiments, a slight increase in the number of elements enables to turn on or off an defect compensating function in a semiconductor memory device in which a selection detecting circuit is made of a part of the memory cell array 300. This makes it possible to read out the content of the compensated area in a case that compensating means is not used. This means that either one of doubled outputs having no relation to a defect can be selectively outputted. Accordingly, if the defect occurs in the compensating means, a further increase in a manufacturing yield can be achieved by using a subjective memory area if it has no defect. Detection of validity of the compensating means is made easy due to a fact that the content in the compensation area can be really read out. Trade off between overhead of area and effect of increase in the yield can be achieved by the introduction of defect compensating means.

Figure 28:
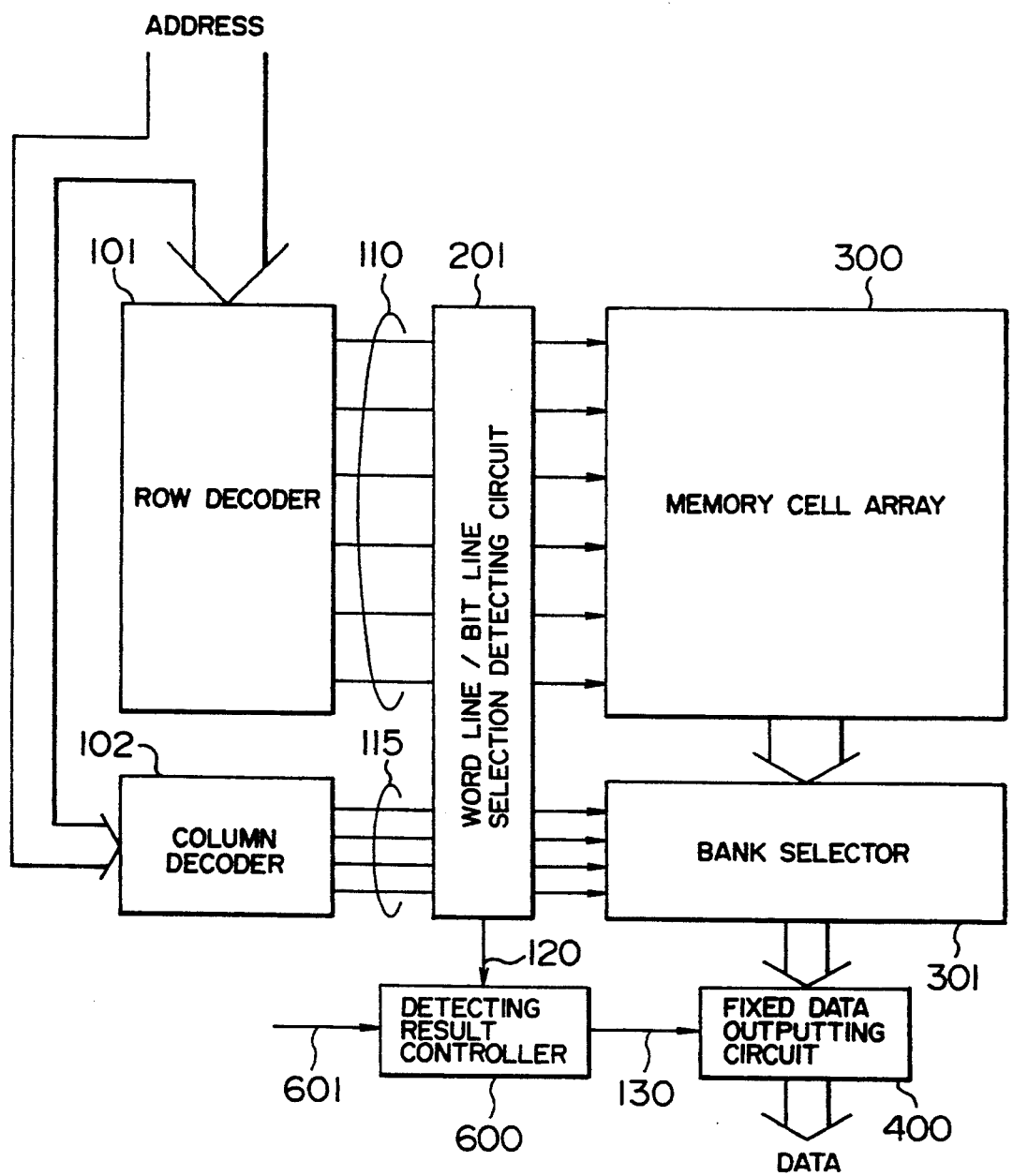
FIG. 28 is a structural view of a modified embodiment of the semiconductor memory device which includes both row and column decoders.

FIG. 28 shows an embodiment of a semiconductor memory device in which an address decoder 100 comprises a row decoder 101, and a column decoder 102, and a bank selector 301 similar to the embodiments described above. In this embodiment, a controller 600 is added to the embodiment shown in FIG. 13.

A detection signal representative of a detecting result obtained from a word line/bit line selection detecting circuit 201 provided on word lines 110 and bit lines 115 is transmitted to a detection result controller 600 via a detection signal line 120. When a control signal on a control line 601 indicates that a detection result is valid, i.e., compensating means is to be operated, an output control line 130 transmits the detection signal to a fixed data outputting circuit 400 and the circuit 400 outputs fixed data independently of a real content in a memory cell array. When the control signal indicates that the detecting result is invalid, i.e., the compensating means is not to be operated, or when any of addresses at a non-compensated area is accessed, the circuit 400 outputs the content of a memory cell array 300 which is read out via a readout circuit including a sense amplifier circuit and the like without changing it.

In accordance with the present invention, the same effects as those of the above-mentioned embodiments can be obtained even if the address decoder comprises a row and column decoders.

Figure 29:
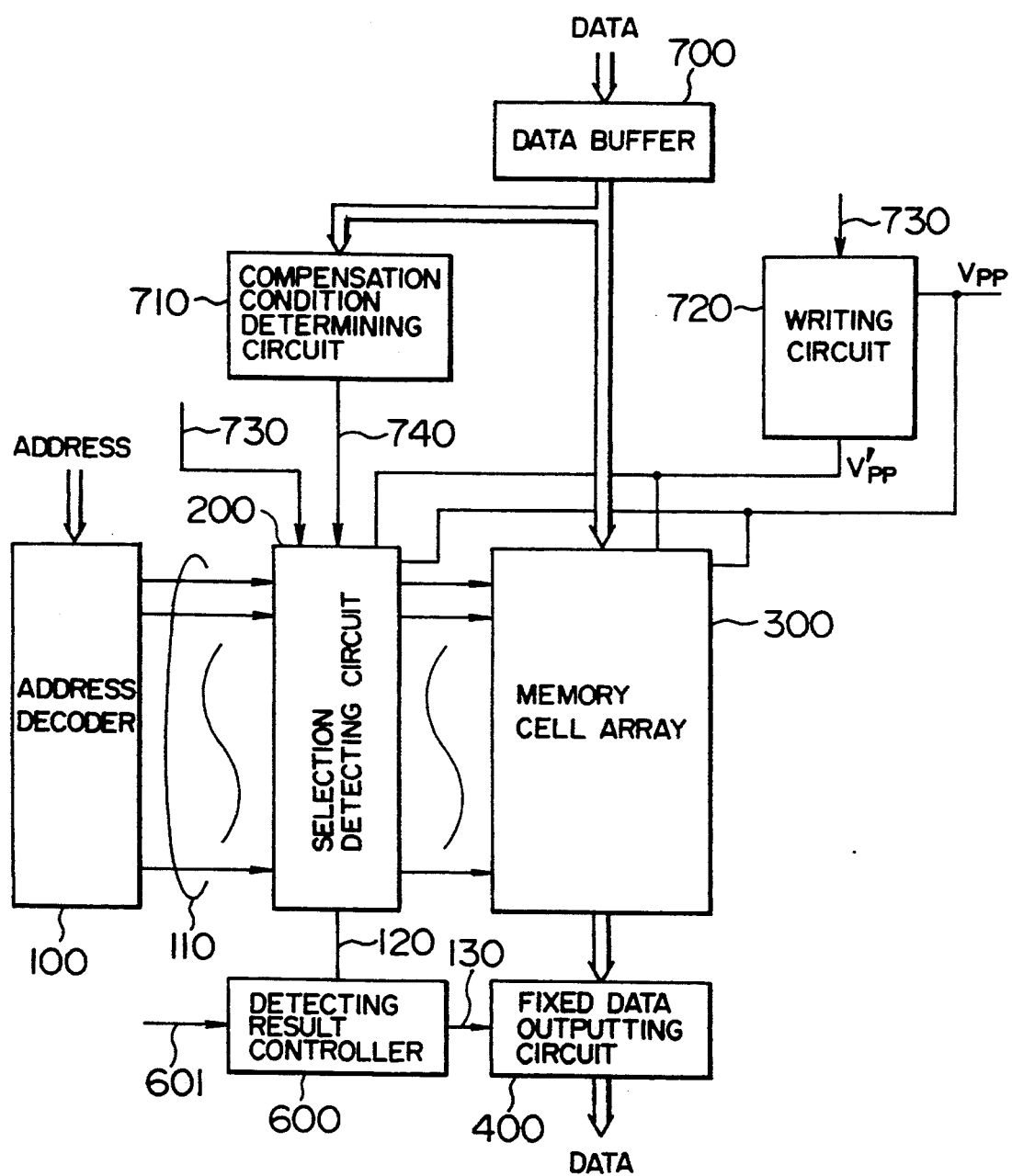
FIG. 29 is a structural view of a modified embodiment of the semiconductor memory device in which electrically programmable memory cell array is used.

FIG. 29 shows an embodiment of the present invention in which a detecting result controller is added to the embodiment shown in FIG. 14. A detection signal representative of a detecting result is transmitted to a detection result controller 600 via a detection signal line 120. When a control signal on a control line 601 indicates that a detection result is valid, i.e., compensating means is to be operated, an output control line 130 transmits the detection signal to a fixed data outputting circuit 400, which then outputs fixed data independently of a real content in a memory cell array. When the control signal indicates that the detecting result is invalid, i.e., the compensating means is not to be operated, or when any of addresses at a non-compensated area is accessed, the circuit 400 outputs the content of a memory cell array 300 which is read out via a readout circuit (sense amplifier, etc.) without changing it.

In accordance with the present invention, the effects same as those of each of the above-mentioned embodiments can be obtained even in the semiconductor memory device in which the memory cell array 300 and the selection detecting circuit 200 are made of EPROMs.

The selection detecting circuit 200 in FIG. 29 is adapted to form connection between the decoded result outputting line 110 and the detection line 210, as shown in FIG. 15.

Figure 30:
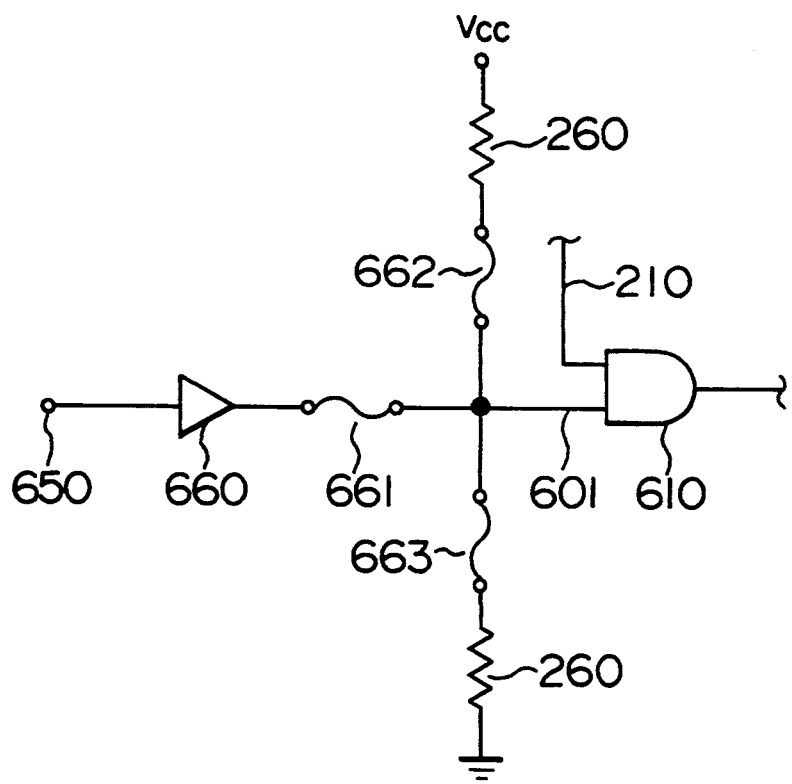
FIG. 30 is a view showing the structure which makes it possible to fix a logical value of detecting result control line.

FIG. 30 is a diagram showing an embodiment which makes it possible to fix the logical value of a control signal of a control line 601 to "0" or "1". The logical value of the control signal may be made variable, or fixed to "0" or "1" by fusing out any two of fuses 661, 662 and 663. That is, it is enough to fuse the fuses 662 and 663 for making the logical value variable, to fuse the fuses 661 and 662 for fixing the value "0", and to fuse the fuses 661 and 663 to fixing the value "1".

Figure 31:
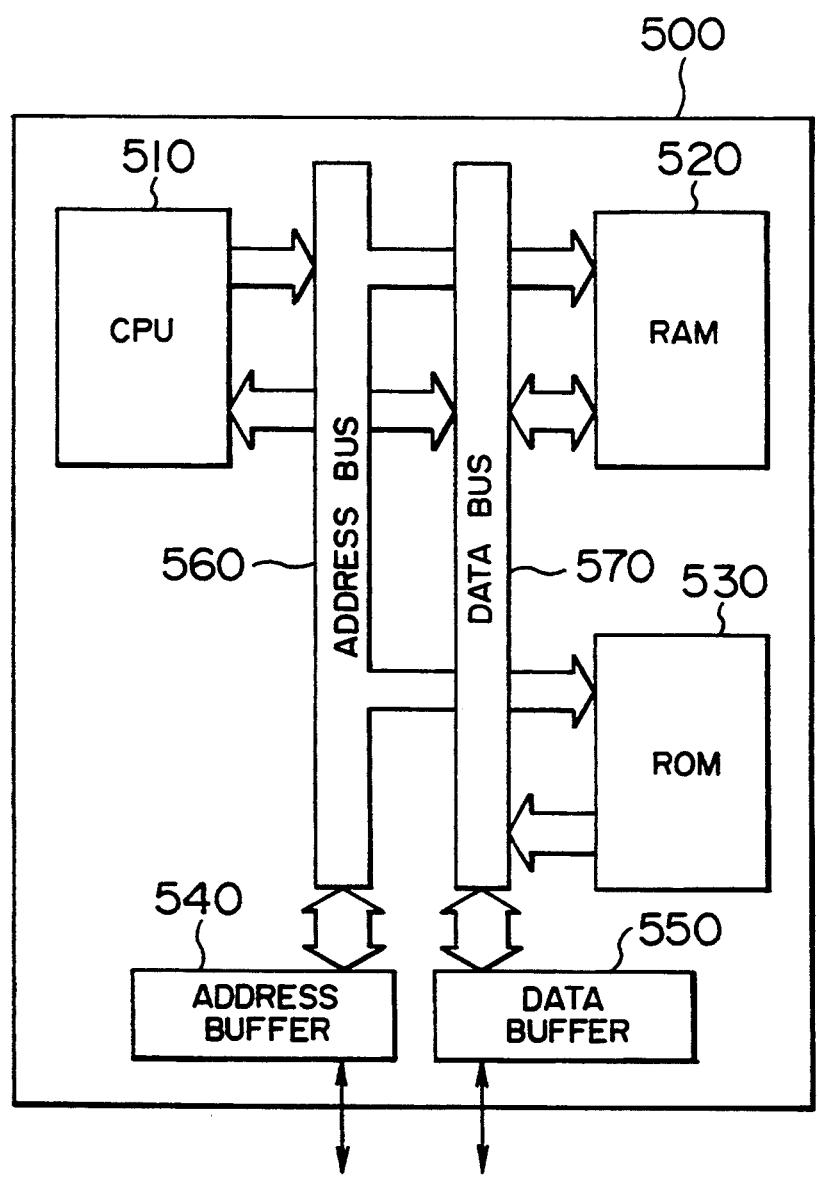
FIG. 31 is a structural view of a microcomputer integrated on one chip in which a read-only semiconductor memory device of the present invention is incorporated.

FIG. 31 shows a logical LSI or microcomputer integrated on one chip having a read only semiconductor memory device of the present invention. It is possible to use the semiconductor memory device of the present invention which has been described with reference to above each embodiment as a part of a logical LSI such as microcomputer.

A logical LSI 500 comprises CPU 510, RAM 520, and ROM 530 which is a semiconductor memory device of the present invention. These components are connected to each other via an address bus 560, a data bus 570 and the like. Communication with external devices is carried out via an address buffer 540 and a data buffer 550. Use of the ROM 530 of the present invention can compensate for a logical LSI chip which has been rejected due to only a defect existing in ROM, and achieve an enhancement of a manufacturing yield.

In the present embodiment, a signal to be supplied to the control line 601 and a writing control signal shown in FIG. 29 can be generated by the CPU 510 on the chip. Of course, these signals can be inputted via pins from the outside of the microcomputer chip.

In accordance with the present invention, a slight increase in the number of elements enables to turn on or off a defect compensating function in a read-only memory device having the defect compensating capability which is high in flexibility to select compensated areas and a read-only memory having a similar capability of compensation for defect in a logical LSI. This makes it possible to read out the content of the compensated area in a case that compensating means is not operated. This means that either one of doubled outputs having no relation a defect can be selectively outputted. Accordingly, if a defect occurs in the compensating means, a further increase in a manufacturing yield can be achieved by using a subjective memory area if it has no defect. Detection of validity of the compensating means is made easy due to a fact that the content in the compensation area can be really read out. Trade off between overhead of area and effect of increase in the yield by the introduction of defect compensating means can be achieved. Accordingly, the time when the sufficient yield is achieved without the compensating means depending upon learning of a manufacturing process can be appropriately known. Thereafter, an advantageous effect of reduction in cost can be achieved by removing the compensating means for reducing an area of the chip.

Now the relation between the number of transistors and the memory capacity which is necessary when 0-compensation is performed in unit of a word including 8 bits or 16 bits will be considered by comparing the present invention with the prior art, for example, Japanese Unexamined Patent Publication No. JP-A-1-241100.

For clarity of comparison, in this consideration assumption is made as follows: In an additional decoder for a prior art ROM, the number of transistors $T_c$ corresponding to the number of intersections between address lines and word lines is assumed to be necessary as is disclosed therein. That is, it is assumed that the decoder performs a full decoding. In the ROM of the present invention, the number of transistors in a fixed data outputting circuit is neglected since it is small. Such transistors are not included in the number of transistors $T_I$ necessary for compensation. The number of transistor $T_n$ of an usual ROM having no compensating means is counted for only decoder and memory cell array.

Figure 32:
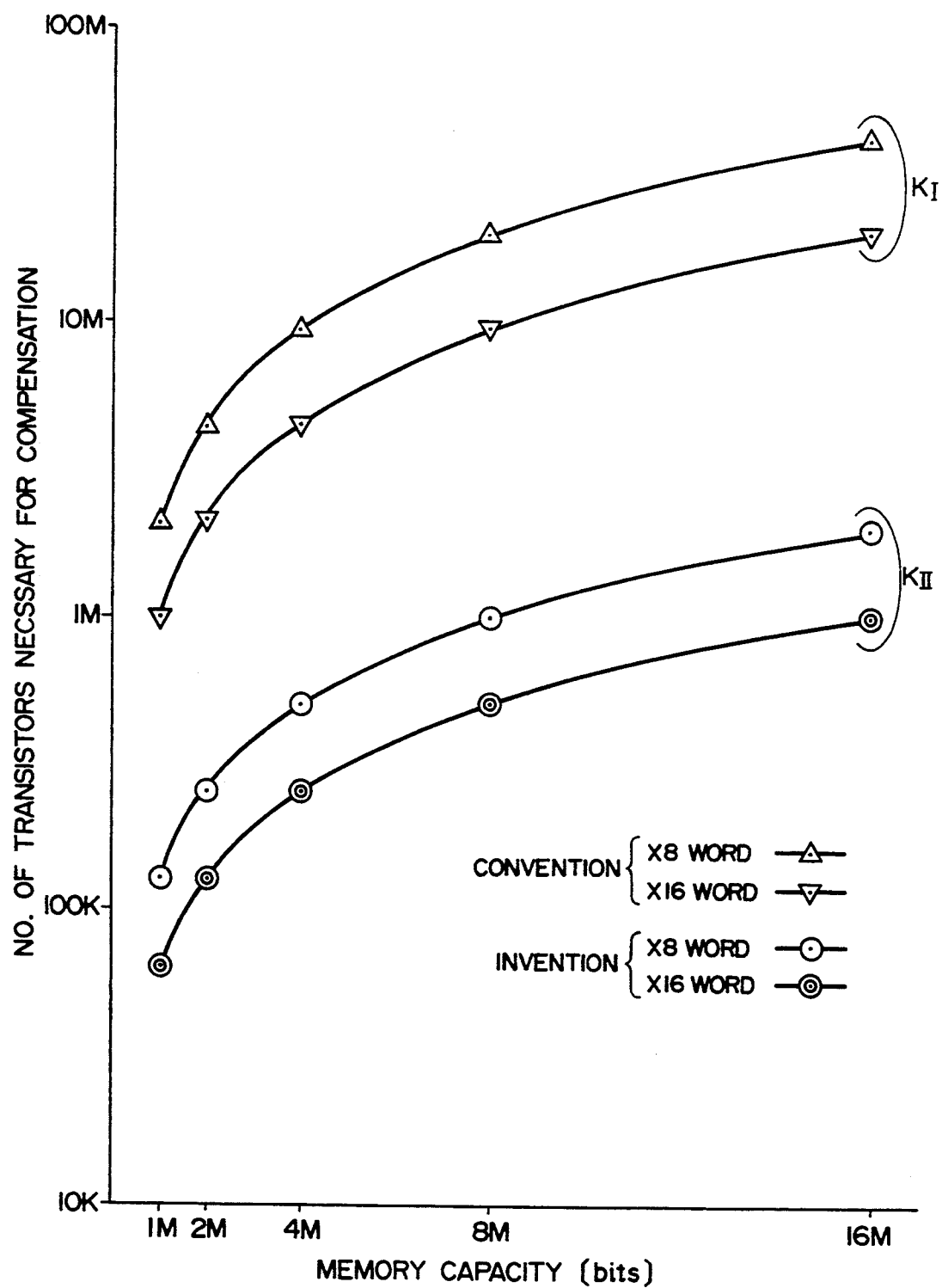

The relation between the memory capacity necessary and the number of transistors for compensation which are calculated under the above assumption is shown in FIG. 32. The rate of increase in transistors is shown in FIG. 33. It is apparent from the above description that one compensation address decoder having the same structure as an address decoder for accessing to a ROM should be provided in addition to the address decoder for obtaining the same effects as the present invention by the above mentioned prior art technique. If this address decoder is constructed by providing transistors at the intersections between the address and data lines for a 1M bit (8 bit×128 k word) ROM, 2.125M transistors are necessary. However, 128 k transistors are sufficient in the structure of the present invention, which are 1/17 of the transistors necessary in the prior art.

What is claimed is:

1. A semiconductor memory device comprising:
  decoding means for decoding an address inputted into the device and generating a decoded result signal on a one of a plurality of word lines based on the decoded address;
  memory cell means, including a plurality of memory cells disposed on said device in a matrix manner and addressable by said plurality of word lines, a part of said plurality of memory cells being predesignated as a compensation area, for outputting read data stored in a first set of said plurality of memory cells from a specified area of said memory cell means specified in accordance with said decoded result signal from said decoding means;
  determining means, connected to ones of said plurality of word lines and responsive to said decoded result signal, for detecting an access to said ones of said plurality of word lines, and determining, from the decoded result signal of said decoding means, an overlapping memory portion where said specified area is coincident with said compensation area and responsive to said access to said ones of said plurality of word lines being detected, generating an overlap output signal when said specified area is determined to overlap with said compensation area; and,
  output means responsive to said overlap output signal for i) directly outputting, in an absence of said overlap output signal, the read data from said memory cell means according to said decoded result signal; and, ii) for outputting, in a presence of said overlap output signal, the read data from said memory cell means according to said decoded result signal excluding read data in said overlapping memory portion together with predetermined data bits for said overlapping memory portion.

2. A semiconductor memory device according to claim 1, wherein said determining means comprises:
   detecting means for detecting that the at least a portion of said specified area overlaps with said compensation area, to generate the output signal; and,
   control means responsive to an inputted signal, for selectively supplying the overlap output signal to said output means.

3. A semiconductor memory device according to claim 1, wherein said determining means includes detecting means for detecting that at least a part of the specified area overlaps with said compensation area in said memory cell means to supply the output signal to said output means.

4. A semiconductor memory device according to claim 1, wherein said determining means includes storage means for storing compensation area data representative of said compensation area with respect to said address and for determining from said compensation area data and the decoded result of said decoding means whether at least a part of the specified area overlaps with said compensation area to supply the overlap output signal to said output means.

5. A semiconductor memory device according to claim 4, wherein said determining means includes write means for writing the compensation area data in said storage means.

6. A semiconductor memory device according to claim 4, wherein said storage means includes programmable memory cells for storing the compensation data.

7. A semiconductor memory device according to claim 1, further including means for setting said compensation area to a one of a binary numeral of zero and one, wherein said determining means includes means for supplying to said output means as the overlap output signal, a first signal selected from among output range signals in accordance with said compensation area, and wherein said output means includes means for storing a predetermined data of bits, and means for reading out some of the data of bits to output the same.

8. A semiconductor memory device according to claim 1, wherein:
   said compensation area includes a first compensation area set for a binary numeral of zero and a second compensation area set for a binary numeral of one, said first compensation area not overlapping with said second compensation area;
   said determining means includes means for supplying to said output means as the overlap output signal, one or more signals selected from among output range signals in accordance with said first and second compensation areas; and,
   said output means includes means for storing a predetermined data of bits for said first and second compensation areas, and means for reading out some of the data of bits to output the same.

9. A semiconductor memory device comprising:
   signal lines;
   decoding means for decoding a first part of an inputted address to drive one of said signal lines as a driven signal line and decoding the other part of the inputted address;
   memory cell means including memory cells arranged in said device in a matrix manner, a part of said memory cells being predesignated as a compensation area and being addressed by first ones of said signal lines, for outputting data bits from memory cells of a specified area associated with the driven signal line and selecting a specific one of the data bits in accordance with the decoding result of the other part of the address by said decoding means;
   detecting means, directly connected to selected ones of said signal lines, for detecting that the driven signal line is addressing said compensation area to generate an output signal; and,
   outputting means for selectively i) directly passing the specific data bit from said memory cell means; and, ii) outputting a predetermined data bit in response to the output signal from said detecting means.

10. A semiconductor memory device according to claim 9, wherein said detecting means comprises detection signal lines selectively connected in a wired-OR manner with said selected ones of said signal lines in accordance with said compensation area, a detection signal being supplied to said outputting means as the output signal through at least a one of said detection signal lines.

11. A semiconductor memory device according to claim 9, wherein said detecting means comprises:
    at least one detection signal line for transferring a detection signal as the output signal to said outputting means; and
    diodes selectively provided between said signal lines and said at least one detection line in accordance with said compensation area such that the detection signal is selectively generated in accordance with the decoding result of said decoding means.

12. A semiconductor memory device according to claim 9, wherein said detecting means comprises:
    at least one detection signal line for transferring a detection signal as the output signal to said outputting means;
    field effect transistors each of which has a gate, a source and a drain selectively connected to one of said signal lines, and said at least one detection signal line, and a ground potential in accordance with said compensation area such that the detection signal is selectively generated in accordance with the decoding result of said decoding means, respectively; and,
    precharging means for charging said at least one detection signal line before said memory cell means is accessed.

13. A semiconductor memory device according to claim 9, wherein said detecting means comprises means for determining whether the driven signal line is associated with said compensation area and generating a detection signal when the driven signal line is determined to be associated with said compensation area, and control means responsive to an inputted output control signal, for selectively outputting the detection signal to said outputting means as the output signal.

14. A semiconductor memory device according to claim 1, wherein said semiconductor memory device is incorporated in a large scale integrated logical circuit comprising a CPU and said semiconductor memory device.

15. A semiconductor memory device according to claim 9, further comprising means for predesignating said compensation area to a binary numeral of zero or one.

16. A semiconductor memory device according to claim 9, wherein said compensation area includes a first compensation area predesignated for a binary numeral of zero and a second compensation area predesignated for a binary numeral of one, said first compensation area not overlapping with said second compensation area; and, wherein said outputting means includes means for storing data bits of zero and data bits of one for said first and second compensation areas, respectively and means for reading out one of the data bits in response to the output signal to output the same.

17. A semiconductor memory device comprising:

decoding means for decoding an address signal inputted into the semiconductor memory device to activate a one of a plurality of decoded word lines according to said address signal;

a wired-OR logic circuit connected to predetermined ones of said plurality of decoded word lines for generating an access signal on an output when any of said predetermined ones of said plurality of decoded word lines are activated by said decoding means;

memory means for storing data bits and for outputting read data bits of the stored data bits corresponding to a first specified region specified in accordance with said inputted address;

generating means, connected to said wired-OR logic circuit and responsive to said access signal, for generating a compensation signal in accordance with association of the first specified region with a predesignated compensation region for a portion of the data bits stored in said memory means; and, data outputting means for normally outputting said read data bits from said memory means and outputting, in response to the compensation signal, compensation data bits in which at least a first portion of said read data bits is replaced by compensation data bits which are stored in said outputting means, the first portion being determined in accordance with the specified region and said compensation region.

18. A semiconductor memory device according to claim 14, wherein said generating means comprises:

means for detecting that the specified region is associated with said compensation region, to generate the compensation signal; and, control means responsive to an inputted control signal, for outputting said compensation signal from said detecting means to said data outputting means.

19. A semiconductor memory device according to claim 17, wherein said semiconductor memory device is incorporated in a large scale integrated logical circuit comprising a CPU and said semiconductor memory device.

20. A semiconductor memory device according to claim 14, wherein said generating means comprises storage means for storing compensation region data indicating said compensation region and selectively outputting said compensation signal in accordance with said inputted address.

21. A semiconductor memory device according to claim 20, wherein said generating means further comprises means for writing the compensation region data in said storage means.

22. A semiconductor memory device according to claim 17, further comprising means for predesignating said compensation area to a binary numeral of zero or one.

23. A semiconductor memory device according to claim 17, wherein said compensation region includes a first compensation region predesignated for binary data bits of zero and a second compensation region predesignated for binary bits of one; and, wherein said outputting means includes means for storing as the compensation data bits data bits of zero and one for said first and second compensation regions, respectively and means for reading out some of the data bits in response to the compensation signal for outputting the compensation data bits.

* * * * *